(12) United States Patent
Nakano

(10) Patent No.: US 11,372,333 B2
(45) Date of Patent: Jun. 28, 2022

(54) TARGET SUPPLY DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventor: Masaki Nakano, Oyama (JP)

(73) Assignee: Gigaphoton Inc., Tochigi (JP)

( * ) Notice: Subject to any disclaimer, the term of this patent is extended or adjusted under 35 U.S.C. 154(b) by 79 days.

(21) Appl. No.: 16/985,158

(22) Filed: Aug. 4, 2020

(65) Prior Publication Data
US 2020/0363728 A1 Nov. 19, 2020

Related U.S. Application Data

(63) Continuation of application No. PCT/JP2018/007833, filed on Mar. 1, 2018.

(51) Int. Cl.
*G03F 7/20* (2006.01)
*H05G 2/00* (2006.01)

(52) U.S. Cl.
CPC ........ *G03F 7/70033* (2013.01); *G03F 7/2004* (2013.01); *G03F 7/70025* (2013.01);
(Continued)

(58) Field of Classification Search
None
See application file for complete search history.

(56) References Cited

U.S. PATENT DOCUMENTS 5,231,291 A 7/1993 Amemiya et al.
5,301,513 A * 4/1994 Duff .................... G05D 23/1912
417/7

(Continued)

FOREIGN PATENT DOCUMENTS

JP H03062920 A 3/1991
JP H10223520 A 8/1998
(Continued)

OTHER PUBLICATIONS

International Search Report issued in PCT/JP2018/007833; dated Jun. 5, 2018.
(Continued)

*Primary Examiner* — Michelle M Iacoletti
(74) *Attorney, Agent, or Firm* — Studebaker & Brackett PC

(57) ABSTRACT

A target supply device according to an aspect of the present disclosure includes a tank in which a target substance in a liquid form is housed, a vibration element configured to generate a droplet of the target substance by providing, through a vibration propagation path, vibration to the target substance output through the nozzle, a first temperature adjustment mechanism configured to adjust a temperature of a refrigerant to be supplied to the vibration propagation path component to a first temperature, a temperature sensor configured to detect a temperature of the vibration propagation path, a second temperature adjustment mechanism configured to adjust, to a second temperature, the temperature of the vibration propagation path to which the refrigerant is supplied, and a control unit configured to control the second temperature adjustment mechanism based on an output from the temperature sensor.

13 Claims, 15 Drawing Sheets

(52) U.S. Cl.
CPC ........... *G03F 7/7055* (2013.01); *H05G 2/006* (2013.01); *H05G 2/008* (2013.01)

(56) References Cited

U.S. PATENT DOCUMENTS

| | | |
|---|---|---|
| 2006/0192153 A1 | 8/2006 | Bykanov et al. |
| 2017/0215266 A1 | 7/2017 | Hirashita et al. |
| 2017/0215267 A1 | 7/2017 | Abe et al. |
| 2018/0288863 A1 | 10/2018 | Fujimaki et al. |

FOREIGN PATENT DOCUMENTS

| | | | |
|---|---|---|---|
| JP | 2010149335 A | 7/2010 | |
| JP | 2010182555 A | 8/2010 | |
| WO | 2016072431 A1 | 5/2016 | |
| WO | 2016079838 A1 | 5/2016 | |
| WO | 2017130323 A1 | 8/2017 | |
| WO | WO-2017130443 A1 * | 8/2017 | ............. H05G 2/006 |

OTHER PUBLICATIONS

International Preliminary Report On Patentability and Written Opinion issued in PCT/JP2018/007833; dated Sep. 1, 2020.

\* cited by examiner

TARGET SUPPLY DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application is a continuation application of International Application No. PCT/JP2018/007833 filed on Mar. 1, 2018, the entire contents of which are hereby incorporated by reference.

BACKGROUND

1. Technical Field

The present disclosure relates to a target supply device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: International Patent Publication No. 2017/130323
Patent Document 2: US Published Patent Application No. 2006/0192153
Patent Document 3: International Patent Publication No. 2016/072431
Patent Document 4: Japanese Unexamined Patent Application Publication No. 2010-149335
Patent Document 5: International Patent Publication No. 2016/079838

SUMMARY

A target supply device according to an aspect of the present disclosure includes a tank in which a target substance in a liquid form is housed, a nozzle through which the target substance housed in the tank is output, a vibration element driven by an electric signal to generate a droplet of the target substance by providing, through a vibration propagation path, vibration to the target substance output through the nozzle, a vibration propagation path component forming at least part of the vibration propagation path, a first temperature adjustment mechanism configured to adjust a temperature of a refrigerant to be supplied to the vibration propagation path component to a first temperature, a temperature sensor configured to detect a temperature of the vibration propagation path, a second temperature adjustment mechanism configured to adjust, to a second temperature, the temperature of the vibration propagation path to which the refrigerant is supplied, and a control unit configured to control the second temperature adjustment mechanism based on an output from the temperature sensor.

An electronic device manufacturing method according to another aspect of the present disclosure includes supplying a target substance from a target supply device into a chamber with an extreme ultraviolet light generation apparatus and irradiating the target substance with a laser beam to generate plasma from the target substance and generate extreme ultraviolet light from the plasma, the extreme ultraviolet light generation apparatus including the chamber and the target supply device configured to supply the target substance into the chamber; outputting the extreme ultraviolet light to an exposure apparatus; and exposing a photosensitive substrate to the extreme ultraviolet light in the exposure apparatus to manufacture an electronic device, the target supply device including a tank in which a target substance in a liquid form is housed, a nozzle through which the target substance housed in the tank is output, a vibration element driven by an electric signal to generate a droplet of the target substance by providing, through a vibration propagation path, vibration to the target substance output through the nozzle, a vibration propagation path component forming at least part of the vibration propagation path, a first temperature adjustment mechanism configured to adjust a temperature of a refrigerant to be supplied to the vibration propagation path component to a first temperature, a temperature sensor configured to detect a temperature of the vibration propagation path, a second temperature adjustment mechanism configured to adjust, to a second temperature, the temperature of the vibration propagation path to which the refrigerant is supplied, and a control unit configured to control the second temperature adjustment mechanism based on an output from the temperature sensor.

A target supply device according to another aspect of the present disclosure includes a tank in which a target substance in a liquid form is housed, a nozzle through which the target substance housed in the tank is output, a vibration element driven by an electric signal to generate a droplet of the target substance by providing, through a vibration propagation path, vibration to the target substance output through the nozzle, a vibration propagation path component forming at least part of the vibration propagation path, a temperature adjustment mechanism configured to adjust a temperature of the vibration propagation path component to a specified control temperature, an energy detector configured to detect energy radiated to the vibration element and the vibration propagation path component from outside of the vibration element and the vibration propagation path component, and a control unit configured to control the temperature adjustment mechanism based on an output from the energy detector.

An electronic device manufacturing method according to another aspect of the present disclosure includes supplying a target substance from a target supply device into a chamber with an extreme ultraviolet light generation apparatus and irradiating the target substance with a laser beam to generate plasma from the target substance and generate extreme ultraviolet light from the plasma, the extreme ultraviolet light generation apparatus including the chamber and the target supply device configured to supply the target substance into the chamber; outputting the extreme ultraviolet light to an exposure apparatus; and exposing a photosensitive substrate to the extreme ultraviolet light in the exposure apparatus to manufacture an electronic device, the target supply device including a tank in which a target substance in a liquid form is housed, a nozzle through which the target substance housed in the tank is output, a vibration element driven by an electric signal to generate a droplet of the target substance by providing, through a vibration propagation path, vibration to the target substance output through the nozzle, a vibration propagation path component forming at least part of the vibration propagation path, a temperature adjustment mechanism configured to adjust a temperature of the vibration propagation path component to a specified control temperature, an energy detector configured to detect energy radiated to the vibration element and the vibration propagation path component from outside of the vibration element and the vibration propagation path component, and a control unit configured to control the temperature adjustment mechanism based on an output from the energy detector.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of extreme ultraviolet light generation system
   1.1 Configuration
   1.2 Operation
2. Terms
3. EUV light generation apparatus including target supply device
   3.1 Configuration
   3.2 Operation
4. Problem
5. Embodiment 1
   5.1 Configuration
   5.2 Operation
   5.3 Effect
6. Embodiment 2
   6.1 Configuration
   6.2 Operation
   6.3 Effect
7. Embodiment 3
   7.1 Configuration
   7.2 Operation
   7.3 Effect
8. Embodiment 4
   8.1 Configuration
   8.2 Operation
   8.3 Effect
9. Embodiment 5
   9.1 Configuration
   9.2 Operation
   9.3 Effect
10. Embodiment 6
   10.1 Configuration
   10.2 Operation
   10.3 Effect
11. Embodiment 7
   11.1 Configuration
   11.2 Operation
   11.3 Effect
12. Embodiment 8
   12.1 Configuration
   12.2 Operation
   12.3 Effect
13. Embodiment 9
   13.1 Configuration
   13.2 Operation
   13.3 Effect 14. Another form including plasma shielding plate
15. Embodiment 10
　　15.1 Configuration
　　15.2 Operation
　　15.3 Effect
16. Specific example of piezoelectric unit
　　16.1 Configuration
　　16.2 Method 1 of fixing piezoelectric-unit temperature sensor
　　16.3 Method 2 of fixing piezoelectric-unit temperature sensor
　　16.4 Operation
　　16.5 Effect
17. Laser apparatus
18. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
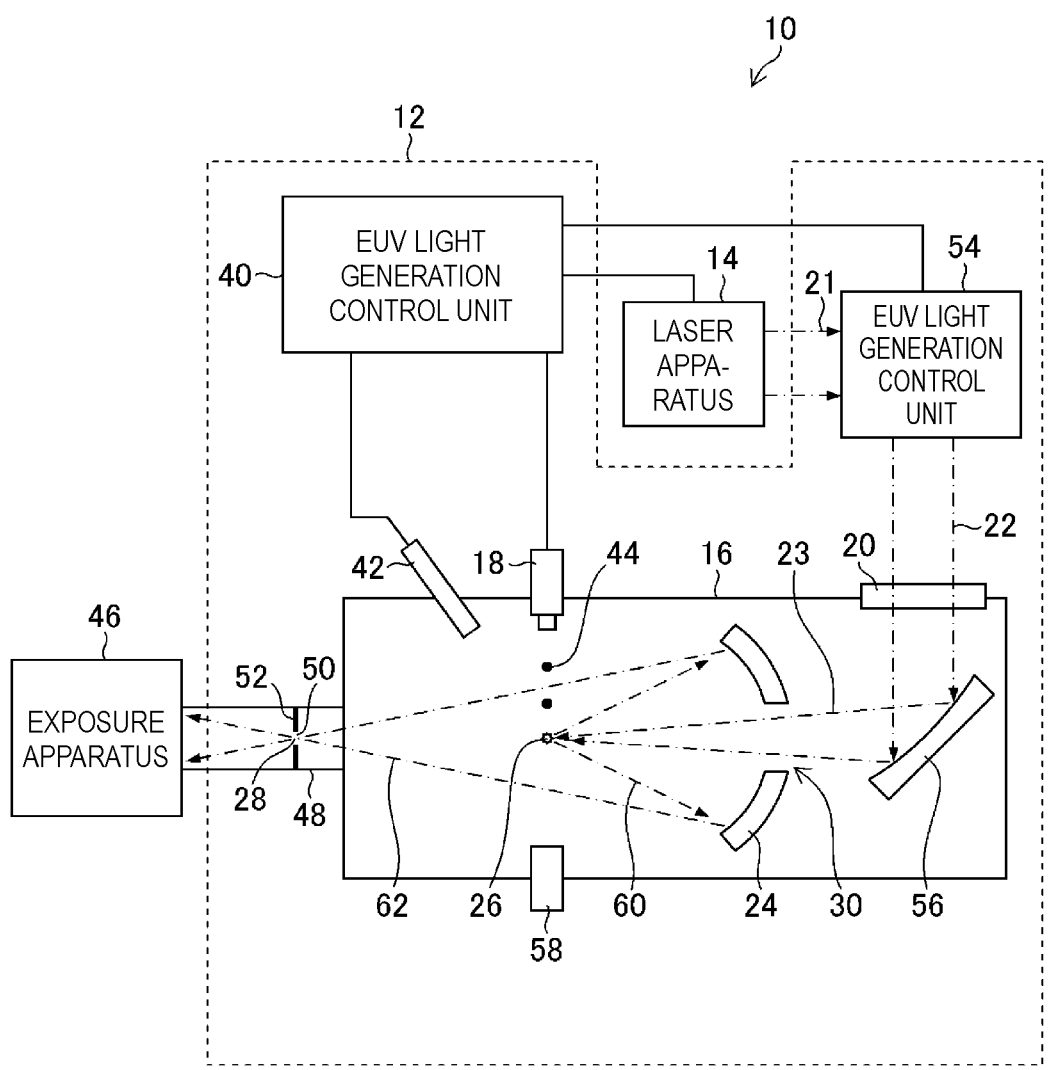
FIG. 1 is a diagram schematically illustrating the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system 10. An EUV light generation apparatus 12 is used together with at least one laser apparatus 14 in some cases. In the present application, a system including the EUV light generation apparatus 12 and the laser apparatus 14 is referred to as the EUV light generation system 10. As illustrated in FIG. 1 and described below in detail, the EUV light generation apparatus 12 includes a chamber 16 and a target supply unit 18.

The chamber 16 is a sealable container. The target supply unit 18 supplies a target substance into the chamber 16 and is, for example, attached to penetrate through a wall of the chamber 16. The material of the target substance may contain tin, terbium, gadolinium, lithium, xenon, or a combination of any two or more thereof, but is not limited thereto.

The wall of the chamber 16 is provided with at least one through-hole. The through-hole is blocked by a window 20 through which a pulse laser beam 22 output from the laser apparatus 14 transmits. For example, an EUV light condensation mirror 24 having a spheroidal surface is disposed inside the chamber 16. The EUV light condensation mirror 24 has a first focal point and a second focal point. For example, a multi-layer reflective film obtained by alternately stacking molybdenum and silicon is formed on the surface of the EUV light condensation mirror 24. For example, the EUV light condensation mirror 24 is disposed to have the first focal point positioned in a plasma generation region 26 and the second focal point positioned at an intermediate focusing point (IF) 28. The EUV light condensation mirror 24 is provided with, at a central part, a through-hole 30 through which a pulse laser beam 23 passes.

The EUV light generation apparatus 12 includes an EUV light generation control unit 40, a target sensor 42, and the like. The target sensor 42 detects one or a plurality of the existence, trajectory, position, and speed of a target 44. The target sensor 42 may have an image capturing function.

The EUV light generation apparatus 12 also includes a connection unit 48 that provides communication between the inside of the chamber 16 and the inside of an exposure apparatus 46. The connection unit 48 includes a wall 52 through which an aperture 50 is formed. The wall 52 is disposed so that the aperture 50 is positioned at the second focal point of the EUV light condensation mirror 24.

The EUV light generation apparatus 12 also includes a laser beam transmission device 54, a laser beam condensation mirror 56, a target collection unit 58 for collecting the target 44, and the like. The laser beam transmission device 54 includes an optical element for defining the transmission state of a laser beam, and an actuator for adjusting the position, posture, and the like of the optical element. The target collection unit 58 is disposed on the extended line of a direction in which the target 44 output into the chamber 16 travels.

The laser apparatus 14 may be a master oscillator power amplifier (MOPA) system. The laser apparatus 14 may include a master oscillator (not illustrated), an optical isolator (not illustrated), and a plurality of $CO_2$ laser amplifiers (not illustrated). The wavelength of a laser beam output from the master oscillator is, for example, 10.59 μm, and the repetition frequency of pulse oscillation is, for example, 100 kHz.

1.2 Operation

The following describes the operation of the exemplary LPP EUV light generation system 10 with reference to FIG. 1. The inside of the chamber 16 is held at a pressure lower than atmospheric pressure, and may be preferably vacuum. Alternatively, gas having a high EUV light transmissivity exists inside the chamber 16. The gas existing inside the chamber 16 may be, for example, hydrogen gas.

A pulse laser beam 21 output from the laser apparatus 14 passes through the laser beam transmission device 54 and is incident in the chamber 16 through the window 20 as the pulse laser beam 22. The pulse laser beam 22 travels along at least one laser beam path in the chamber 16 and is reflected by the laser beam condensation mirror 56 and incident on at least one target 44 as the pulse laser beam 23.

The target supply unit 18 outputs the target 44 made of the target substance toward the plasma generation region 26 in the chamber 16. The target supply unit 18 forms droplets by, for example, a continuous jet scheme. In the continuous jet scheme, a nozzle is vibrated to provide periodic vibration to flow of the target substance ejected in a jet form from a nozzle hole, thereby periodically separating the target substance. The separated target substance forms a free interface by the own surface tension, thereby forming a droplet.

The target 44 is irradiated with at least one pulse included in the pulse laser beam 23. Plasma is generated from the target 44 irradiated with the pulse laser beam, and radiates radiation light 60. EUV light 62 included in the radiation light 60 is selectively reflected by the EUV light condensation mirror 24. Having been reflected by the EUV light condensation mirror 24, the EUV light 62 is condensed at the intermediate focusing point 28 and output to the exposure apparatus 46. One target 44 may be irradiated with a plurality of pulses included in the pulse laser beam 23.

The EUV light generation control unit 40 collectively controls the entire EUV light generation system 10. The EUV light generation control unit 40 processes a result of detection by the target sensor 42. The EUV light generation control unit 40 controls, based on the result of detection by the target sensor 42, the output timing of the target 44, the output direction of the target 44, and the like. In addition, the EUV light generation control unit 40 controls the oscillation timing of the laser apparatus 14, the traveling direction of the pulse laser beam 22, the focusing position of the pulse laser beam 23, and the like. These various kinds of control are merely exemplary, and may include other control as necessary.

2. Terms

"Target" is an object irradiated with a laser beam introduced into the chamber. Plasma is generated from the target irradiated with the laser beam and radiates EUV light. The target is the plasma generation source.

"Droplet" is a form of a target supplied into the chamber. The droplet may be the target having a substantially spherical shape by the surface tension of the target substance being melted.

"Pulse laser beam" may be a laser beam including a plurality of pulses.

"Laser beam" is not limited to a pulse laser beam but may be a laser beam in general.

"Laser beam path" is an optical path of a laser beam.

"$CO_2$" is carbon dioxide.

"Plasma light" is radiation light radiated from plasma of the target. This radiation light includes EUV light.

"EUV light" stands for "extreme ultraviolet light". "EUV light generation apparatus" stands for "extreme ultraviolet light generation apparatus".

"Piezoelectric element" is synonymous with a dielectric element. The piezoelectric element is simply referred to as "piezoelectric" in some cases. The piezoelectric element is an exemplary vibration element.

Figure 2:
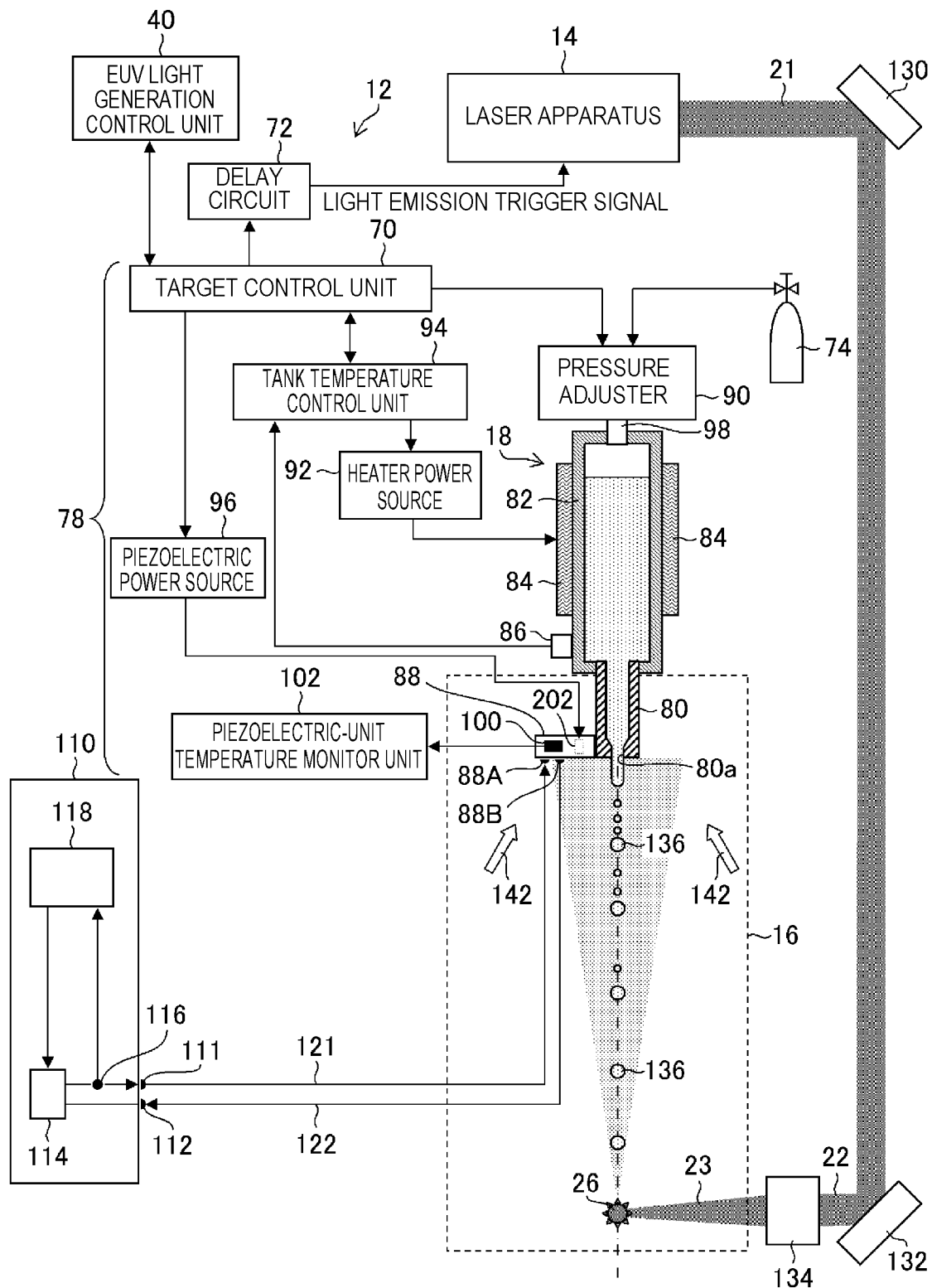
FIG. 2 is a diagram schematically illustrating the configuration of an EUV light generation apparatus including a target supply device.

3. EUV Light Generation Apparatus Including Target Supply Device 3.1 Configuration FIG. 2 schematically illustrates the configuration of an EUV light generation apparatus including a target supply device. The EUV light generation apparatus 12 includes the target supply unit 18, a target control unit 70, a delay circuit 72, and an inert gas supply unit 74.

The target supply unit 18 includes a nozzle 80 through which the target substance is output, a tank 82 in which the target substance is stored, a heater 84, a tank temperature sensor 86, a piezoelectric unit 88, and a pressure adjuster 90.

The EUV light generation apparatus 12 includes a heater power source 92, a tank temperature control unit 94, a piezoelectric power source 96, a piezoelectric-unit temperature sensor 100, a piezoelectric-unit temperature monitor unit 102, and a chiller unit 110.

A target supply device 78 includes the target supply unit 18, the target control unit 70, the heater power source 92, the tank temperature control unit 94, the piezoelectric power source 96, the piezoelectric-unit temperature sensor 100, and the piezoelectric-unit temperature monitor unit 102. The chiller unit 110 may be included in the configuration of the target supply device 78. The target supply device 78 may include a droplet detection device not illustrated in FIG. 2. The droplet detection device is an exemplary target sensor 42 described with reference to FIG. 1. The droplet detection device may detect the existence of a droplet at a predetermined position on the droplet trajectory and may output a signal indicating the pass timing of a droplet 136 passing through the predetermined position.

The tank 82 is formed in a hollow tubular shape. The target substance is housed in the hollow tank 82. At least the inside of the tank 82 is formed of a material unlikely to react with the target substance. When tin as an exemplary target substance is used, for example, any of SiC, $SiO_2$, $Al_2O_3$, molybdenum, tungsten, and tantalum may be used as a material unlikely to react with tin.

The heater 84 and the tank temperature sensor 86 are fixed to the tank 82. The heater 84 is fixed to an outer side surface part of the tubular tank 82. The heater 84 fixed to the tank 82 heats the tank 82. The heater 84 is connected with the heater power source 92.

The heater power source 92 supplies electrical power to the heater 84. The heater power source 92 is connected with the tank temperature control unit 94. The tank temperature control unit 94 may be connected with the target control unit 70 or may be included in the target control unit 70. The electrical power supply from the heater power source 92 to the heater 84 is controlled by the tank temperature control unit 94.

The tank temperature sensor 86 is fixed to the outer side surface part of the tank 82. The tank temperature sensor 86 is connected with the tank temperature control unit 94. The tank temperature sensor 86 detects the temperature of the tank 82 and outputs tank temperature information to the tank temperature control unit 94. The tank temperature control unit 94 can adjust the electrical power supplied to the heater 84 based on the tank temperature information output from the tank temperature sensor 86. The tank temperature control unit 94 outputs a heater power source control signal to the heater power source 92.

A tank temperature adjustment mechanism including the heater 84 and the heater power source 92 can adjust the temperature of the tank 82 based on the heater power source control signal from the tank temperature control unit 94.

The pressure adjuster 90 is disposed on a pipe 98 between the inert gas supply unit 74 and the tank 82. The pipe 98 can provide communication between the target supply unit 18 including the tank 82 and the pressure adjuster 90. The pipe 98 may be covered by a heat insulation material (not illustrated) or the like. A heater (not illustrated) is disposed on the pipe 98. The temperature in the pipe 98 may be maintained equal to the temperature in the tank 82 of the target supply unit 18.

The inert gas supply unit 74 includes a gas tank filled with inert gas such as helium or argon. The inert gas supply unit 74 supplies the inert gas into the tank 82 through the pressure adjuster 90. In the present example, the inert gas is argon.

The pressure adjuster 90 may include an electromagnetic valve, a pressure sensor, and the like (not illustrated) for gas supply and discharge. The pressure adjuster 90 detects the pressure in the tank 82 by using the pressure sensor (not illustrated). The pressure adjuster 90 is coupled with a discharge pump (not illustrated). The pressure adjuster 90 operates the discharge pump (not illustrated) to discharge gas from the tank 82.

The pressure adjuster 90 can increase or decrease the pressure in the tank 82 by supplying gas into the tank 82 or discharging gas from the tank 82. The pressure adjuster 90 is connected with the target control unit 70. The pressure adjuster 90 outputs a detection signal of a detected pressure to the target control unit 70. The pressure adjuster 90 receives a control signal output from the target control unit 70.

The target control unit 70 supplies, based on the detection signal output from the pressure adjuster 90, the pressure adjuster 90 with a pressure command signal for controlling the operation of the pressure adjuster 90 so that the pressure in the tank 82 becomes equal to a target pressure. The pressure adjuster 90 supplies gas into the tank 82 or discharges gas from the tank 82 based on the pressure command signal from the target control unit 70. The pressure in the tank 82 can be adjusted to the target pressure through the gas supply or discharge by the pressure adjuster 90.

The nozzle 80 includes a nozzle hole 80a through which the target substance is output. The target substance output through the nozzle hole 80a may be, for example, liquid tin.

The nozzle 80 is provided at a bottom surface part of the tubular tank 82. The nozzle 80 is disposed inside the chamber 16 through a target supply hole (not illustrated) of the chamber 16. The target supply hole of the chamber 16 is blocked when the target supply unit 18 is disposed. When the target supply unit 18 is disposed to block the target supply hole of the chamber 16, the inside of the chamber 16 is isolated from atmosphere. At least the inner surface of the nozzle 80 is formed of a material unlikely to react with the target substance.

One end of the nozzle 80 is fixed to the hollow tank 82. The other end of the nozzle 80 is provided with the nozzle hole 80a. The tank 82 on the one end side of the nozzle 80 is positioned outside the chamber 16, and the nozzle hole 80a on the other end side of the nozzle 80 is positioned inside the chamber 16. Instead, the tank 82 may be positioned inside the chamber 16. In this case, part of the tank 82 including the heater 84 may be positioned inside the chamber 16. However, in this case as well, the nozzle hole 80a on the other end side of the nozzle 80 is positioned inside the chamber 16. The plasma generation region 26 inside the chamber 16 is positioned on the extended line of the center axis of the nozzle hole 80a. The insides of the tank 82, the nozzle 80, and the chamber 16 are communicated with each other.

The nozzle hole 80a is formed in such a shape that the target substance being melted is ejected in a jet form into the chamber 16.

The piezoelectric unit 88 is fixed to the nozzle 80. The piezoelectric unit 88 includes a piezoelectric element 202. The piezoelectric element 202 is connected with the piezoelectric power source 96. The piezoelectric unit 88 provides vibration to the nozzle 80. The target supply unit 18 forms the droplet 136 by, for example, the continuous jet scheme.

When a piezoelectric drive signal of square wave having a predetermined frequency is applied from the piezoelectric power source 96 to the piezoelectric element 202, the droplets 136 of tin are continuously discharged through the nozzle 80. While falling, a plurality of droplets discharged through the nozzle 80 can be connected with each other and become the droplet 136 as an integration having a necessary mass.

The piezoelectric unit 88 and the piezoelectric power source 96 may be elements of a droplet formation mechanism that provides vibration necessary for forming the droplet 136 to the nozzle 80. Vibration generated by the piezoelectric element 202 propagates to the nozzle 80 through components of the piezoelectric unit 88.

The piezoelectric power source 96 supplies electrical power to the piezoelectric element 202. The piezoelectric power source 96 is connected with the target control unit 70. The electrical power supply from the piezoelectric power source 96 to the piezoelectric element 202 is controlled by the target control unit 70.

The piezoelectric-unit temperature sensor 100 measures the temperature of the piezoelectric unit 88. The temperature of the piezoelectric unit 88 is referred to as a "piezoelectric-unit temperature". The piezoelectric unit 88 is an element forming part of a vibration propagation path, and piezoelectric-unit temperature information directly or indirectly indicates the temperature of the vibration propagation path. In the present embodiment, the piezoelectric-unit temperature is used as information indicating the temperature of the vibration propagation path.

The piezoelectric-unit temperature sensor 100 is fixed to the piezoelectric unit 88. The piezoelectric-unit temperature sensor 100 is connected with the piezoelectric-unit temperature monitor unit 102.

The piezoelectric-unit temperature monitor unit 102 is a device configured to monitor the piezoelectric-unit temperature information obtained from the piezoelectric-unit temperature sensor 100. This "monitoring" includes continuous monitoring or monitoring at an appropriate time interval. The piezoelectric-unit temperature monitor unit 102 may include a display device or indicator configured to visualize and output the piezoelectric-unit temperature information.

The piezoelectric unit 88 is provided with a cooling water introduction port 88A and a cooling water discharge port 88B. The piezoelectric unit 88 includes a cooling water path extending from the cooling water introduction port 88A to the cooling water discharge port 88B. The cooling water path inside the piezoelectric unit 88, which is not illustrated in FIG. 2, is indicated by reference sign 214 in FIG. 13. An exemplary configuration of the piezoelectric unit 88 will be described later with reference to FIGS. 13 and 14.

The chiller unit 110 is a cooling water circulation device configured to supply cooling water as a refrigerant that cools the piezoelectric unit 88 to the piezoelectric unit 88. A cooling water exit 111 of the chiller unit 110 is connected with the cooling water introduction port 88A of the piezoelectric unit 88 through a cooling water supply flow path 121. A cooling water entrance 112 of the chiller unit 110 is connected with the cooling water discharge port 88B of the piezoelectric unit 88 through a cooling water return flow path 122.

The chiller unit 110 includes a cooling water heating-cooling unit 114, a cooling water temperature sensor 116, and a cooling water temperature control unit 118. The cooling water heating-cooling unit 114 is a temperature adjustment device having a function to heat cooling water and a function to cool cooling water. The cooling water heating-cooling unit 114 includes a heater and a cooler (not illustrated). The cooler includes a heat exchanger. The cooling water heating-cooling unit 114 is connected with the cooling water temperature control unit 118.

The cooling water temperature sensor 116 measures the temperature of cooling water on the cooling water exit side in the chiller unit 110. The cooling water temperature sensor 116 is disposed on an exit-side flow path connecting the cooling water heating-cooling unit 114 and the cooling water exit 111. The cooling water temperature sensor 116 is connected with the cooling water temperature control unit 118.

The cooling water temperature control unit 118 controls the operation of the cooling water heating-cooling unit 114. The cooling water temperature control unit 118 transmits a cooling water temperature control signal to the cooling water heating-cooling unit 114 based on cooling water temperature information output from the cooling water temperature sensor 116.

The target control unit 70 can detect the existence of the droplet 136 at a predetermined position on the droplet trajectory based on an output signal from the target sensor 42

(refer to FIG. 1). In particular, the target control unit 70 can detect the timing at which the droplet 136 passes through the predetermined position on the droplet trajectory. A pass timing signal indicating the timing at which the droplet 136 passes through the predetermined position on the droplet trajectory may be generated by the target sensor 42 or may be generated by the target control unit 70 based on the output from the target sensor 42.

The pass timing signal is input to the delay circuit 72 through the target control unit 70. The delay circuit 72 is connected with a signal line for the target control unit 70 to set a delay time of the delay circuit 72. The delay circuit 72 may be configured as part of the target control unit 70. An output from the delay circuit 72 is input to the laser apparatus 14 as a light emission trigger signal.

The EUV light generation apparatus 12 includes a first high reflectance mirror 130, a second high reflectance mirror 132, and a laser beam condensation optical system 134. The laser beam transmission device 54 described with reference to FIG. 1 includes the first high reflectance mirror 130 and the second high reflectance mirror 132. The laser beam condensation optical system 134 includes the laser beam condensation mirror 56 described with reference to FIG. 1.

The chamber 16 of the EUV light generation apparatus 12 is formed in, for example, a hollow spherical shape or tubular shape. The center axis of the tubular chamber 16 may be aligned with a direction in which the EUV light 62 is guided out to the exposure apparatus 46. The chamber 16 includes an exhaust device and a pressure sensor (not illustrated).

The EUV light generation control unit 40 transmits and receives signals to and from an exposure apparatus control unit (not illustrated) as a control unit of the exposure apparatus 46. The EUV light generation control unit 40 collectively controls the entire operation of the EUV light generation system 10 based on a command from the exposure apparatus 46. The EUV light generation control unit 40 transmits and receives control signals to and from the laser apparatus 14. In this manner, the EUV light generation control unit 40 controls the operation of the laser apparatus 14.

The EUV light generation control unit 40 transmits and receives control signals to and from an actuator (not illustrated) of each of the laser beam transmission device 54 and the laser beam condensation optical system 134. In this manner, the EUV light generation control unit 40 adjusts the traveling direction and focusing position of each of the pulse laser beams 21, 22, and 23.

The EUV light generation control unit 40 transmits and receives control signals to and from the target control unit 70 of the target supply device 78. In this manner, the EUV light generation control unit 40 controls the operation of the target supply device 78 and the laser apparatus 14.

In the present disclosure, the EUV light generation control unit 40, the target control unit 70, the tank temperature control unit 94, piezoelectric-unit temperature feedback control units 150 and 151 to be described later, piezoelectric-unit temperature feedforward control units 166 and 167 to be described later, and any other control device can be achieved by hardware and software combination of one or a plurality of computers. Each computer may include a central processing unit (CPU) and a memory. The software is synonymous with a computer program. The computers conceptually include a programmable controller.

Some or all of processing functions of the EUV light generation control unit 40, the target control unit 70, the tank temperature control unit 94, the piezoelectric-unit temperature feedback control units 150 and 151, and the piezoelectric-unit temperature feedforward control units 166 and 167, and the other control device may be each achieved by using an integrated circuit such as a field programmable gate array (FPGA) or an application specific integrated circuit (ASIC).

The functions of these control devices can be achieved by a single control device. Moreover, in the present disclosure, these control devices may be connected with each other through a communication network such as a local area network or the Internet. In distributed computing environment, a computer program unit may be stored in both of local and remote memory storage devices.

3.2 Operation

The following describes the operation of the EUV light generation apparatus 12 with reference to FIG. 2. The EUV light generation control unit 40 controls the exhaust device (not illustrated) so that the inside of the chamber 16 is vacuum. The EUV light generation control unit 40 controls, based on a value detected by the pressure sensor (not illustrated), discharge by the exhaust device and gas supply from a gas supply device (not illustrated) so that the pressure inside the chamber 16 is in a predetermined range.

When having received a target generation signal from the EUV light generation control unit 40, the target control unit 70 controls the heater 84 through the tank temperature control unit 94 so that the target substance in the target supply unit 18 has a predetermined temperature equal to or higher than the melting point. The tank temperature control unit 94 controls the heater power source 92 based on a detected value of the tank temperature sensor 86 under control of the target control unit 70. The tank temperature control unit 94 transmits the heater power source control signal to the heater power source 92. The heater power source 92 supplies heater electrical power to the heater 84 in accordance with the heater power source control signal. When tin (Sn), which has a melting point of 232° C., is used as the target substance, the target control unit 70 controls the heater 84 so that tin in the target supply unit 18 has, for example, a predetermined temperature in the range of 232° C. to 300° C. As a result, tin stored in the target supply unit 18 melts into liquid. The melted tin may correspond to a form of "target substance in a liquid form".

To discharge the liquid target substance through the nozzle hole 80a, the target control unit 70 controls the pressure adjuster 90 so that the pressure in the tank 82 becomes a predetermined pressure. The pressure adjuster 90 can increase or decrease the pressure in the tank 82 by supplying gas into or discharging gas from the tank 82 based on a control signal from the target control unit 70. Specifically, the pressure adjuster 90 adjusts, in accordance with an instruction from the target control unit 70, the pressure in the tank 82 to a predetermined value so that the droplet 136 reaches the plasma generation region 26 through a predetermined target trajectory at a predetermined target speed.

The predetermined target speed of the droplet 136 may be in, for example, the range of 60 m/s to 120 m/s. The predetermined value of the pressure of the tank 82 may be in, for example, the range of several MPa to 40 MPa. As a result, a jet of the liquid target substance is ejected at the predetermined speed through the nozzle hole 80a.

The target control unit 70 transmits an electric signal having a predetermined piezoelectric drive frequency and a predetermined duty to the piezoelectric element 202 through the piezoelectric power source 96 so that the droplet 136 is generated from the liquid tin output through the nozzle 80.

Specifically, the target control unit 70 transmits a voltage waveform signal for piezoelectric drive to the piezoelectric power source 96.

The piezoelectric power source 96 supplies piezoelectric drive voltage to the piezoelectric element 202 in accordance with an instruction from the target control unit 70. The piezoelectric element 202 vibrates when the piezoelectric drive voltage is applied to the piezoelectric element 202. The vibration of the piezoelectric element 202 propagates to the nozzle 80, and the liquid target substance vibrates through the nozzle 80. The droplets 136 having volumes substantially equal to each other are periodically generated when the jet of the liquid tin output through the nozzle hole 80a is provided with regular vibration that promotes droplet connection. Then, each droplet 136 can be supplied to the plasma generation region 26.

As the droplet 136 passes through the predetermined position on the droplet trajectory between the nozzle hole 80a and the plasma generation region 26, the target sensor 42 generates a detection signal. The detection signal output from the target sensor 42 is transferred to the target control unit 70. The target control unit 70 generates a pass timing signal indicating the pass timing of the droplet. The pass timing signal is input from the target control unit 70 to the delay circuit 72.

The delay circuit 72 generates a light emission trigger signal behind the pass timing signal by a delay time, and inputs the light emission trigger signal to the laser apparatus 14. The delay time of the delay circuit 72 is set so that the light emission trigger signal is input to the laser apparatus 14 before the droplet 136 reaches the plasma generation region 26 after passing through the predetermined position. In other words, the delay time is set so that the droplet 136 is irradiated with a pulse laser beam output from the laser apparatus 14 when the droplet 136 reaches the plasma generation region 26.

The pulse laser beam output from the laser apparatus 14 is guided to the plasma generation region 26 through the first high reflectance mirror 130, the second high reflectance mirror 132, and the laser beam condensation optical system 134, and incident on the droplet 136. The plasma generation region 26 may correspond to the focusing position of the pulse laser beam.

The piezoelectric-unit temperature sensor 100 measures the temperature of the piezoelectric unit 88. The piezoelectric-unit temperature information output from the piezoelectric-unit temperature sensor 100 is transferred to the piezoelectric-unit temperature monitor unit 102. The piezoelectric-unit temperature is monitored by the piezoelectric-unit temperature monitor unit 102.

The cooling water heating-cooling unit 114 is feedback-controlled by the cooling water temperature sensor 116 and the cooling water temperature control unit 118 mounted on the chiller unit 110. The cooling water temperature information output from the cooling water temperature sensor 116 is transferred to the cooling water temperature control unit 118. The cooling water temperature control unit 118 controls the cooling water heating-cooling unit 114 to eliminate the difference between a target cooling water temperature and a temperature detected by the cooling water temperature sensor 116 provided on the cooling water exit side. Accordingly, the temperature of cooling water at the cooling water exit 111 of the chiller unit 110, in other words, an exit temperature of the chiller unit 110 is held at, for example, a constant temperature in the allowable range of the target cooling water temperature±0.1° C.

4. Problem

The exit temperature of the chiller unit 110 is controlled to be constant based on the output from the cooling water temperature sensor 116, but the temperature of the piezoelectric unit 88 is not necessarily constant. In particular, the piezoelectric-unit temperature changes when the piezoelectric unit 88 receives thermal disturbances such as radiation 140 from plasma and heat transfer due to gas convection 142. In FIG. 2, the radiation range of the radiation 140 from plasma is schematically illustrated as a gray colored region. In addition, in FIG. 2, the gas convection 142 is schematically illustrated as white arrows.

At EUV light emission, the piezoelectric unit 88 can be heated by radiation heat from plasma. Since, for example, hydrogen gas is introduced into the chamber 16, hydrogen gas is heated at EUV light emission, and the piezoelectric unit 88 is heated due to convection of the hydrogen gas in some cases.

As the piezoelectric-unit temperature changes due to various disturbance factors including radiation heat and convection heat, a vibration propagating state changes and droplet connection becomes unstable, and as a result, EUV light emission becomes unstable.

5. Embodiment 1

5.1 Configuration

Figure 3:
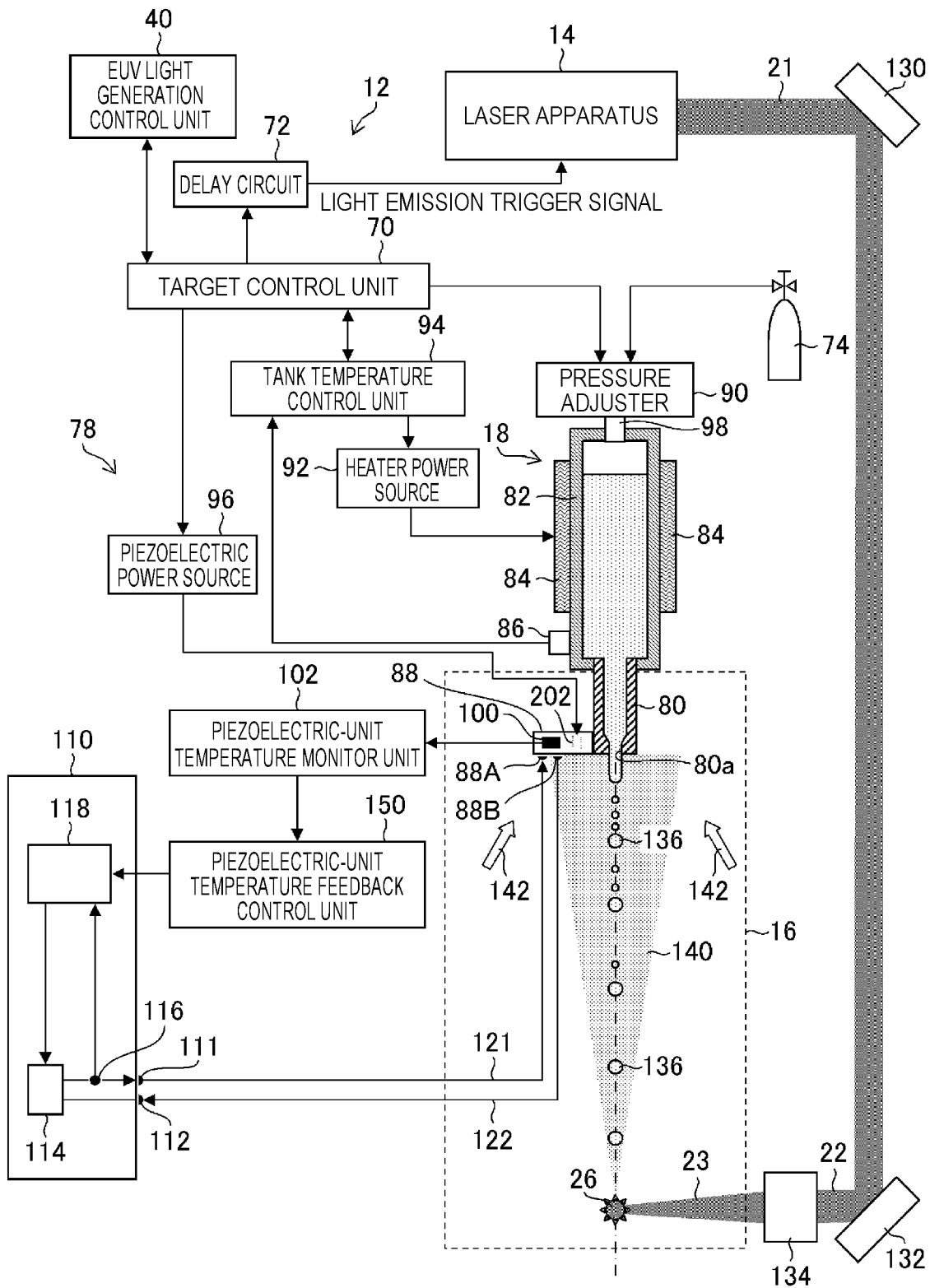
FIG. 3 is a diagram schematically illustrating the configuration of the EUV light generation apparatus including the target supply device according to Embodiment 1.

FIG. 3 schematically illustrates the configuration of the EUV light generation apparatus including the target supply device according to Embodiment 1. The following describes differences from the configuration illustrated in FIG. 2.

The target supply device 78 according to Embodiment 1 illustrated in FIG. 3 includes the piezoelectric-unit temperature feedback control unit 150 for controlling the chiller exit temperature based on the piezoelectric-unit temperature information from the piezoelectric-unit temperature monitor unit 102 so that the piezoelectric-unit temperature is constant. "Being constant" includes being substantially constant with variation and variance in a predetermined allowable temperature range including a control target temperature.

The piezoelectric-unit temperature feedback control unit 150 is connected with the piezoelectric-unit temperature monitor unit 102. The piezoelectric-unit temperature feedback control unit 150 is also connected with the cooling water temperature control unit 118 of the chiller unit 110.

The piezoelectric-unit temperature feedback control unit 150 feedback-controls the exit temperature of the chiller unit 110 through the cooling water temperature control unit 118 of the chiller unit 110 based on the piezoelectric-unit temperature information from the piezoelectric-unit temperature monitor unit 102 so that the piezoelectric-unit temperature is constant. The piezoelectric-unit temperature feedback control unit 150 transmits a feedback control signal to the cooling water temperature control unit 118 of the chiller unit 110 in accordance with the piezoelectric-unit temperature information.

The piezoelectric-unit temperature feedback control unit 150 does not necessarily need to acquire the piezoelectric-unit temperature information from the piezoelectric-unit temperature monitor unit 102, but may acquire the piezoelectric-unit temperature information directly from the piezoelectric-unit temperature sensor 100.

Typically, the piezoelectric-unit temperature sensor 100 is a thermocouple. For example, a thermocouple such as K-TYPE can be used as the piezoelectric-unit temperature sensor 100. A temperature sensing unit of the piezoelectric-unit temperature sensor 100 is desirably disposed as close to the vibration propagation path as possible without encumbering vibration propagation.

The temperature sensing unit is, for example, a thermocouple leading end part. The temperature sensing unit may be inserted into a component of the piezoelectric unit 88. In such a configuration, a hole may be formed at the component of the piezoelectric unit 88, and the temperature sensing unit may be inserted into the hole. After the temperature sensing unit is inserted into the component of the piezoelectric unit 88, the piezoelectric-unit temperature sensor 100 may be fixed by using a clamp member, a fastening bolt, or the like so that the piezoelectric-unit temperature sensor 100 does not move.

5.2 Operation

In the configuration illustrated in FIG. 3, the piezoelectric-unit temperature is measured by using the piezoelectric-unit temperature sensor 100 and monitored by the piezoelectric-unit temperature monitor unit 102. The piezoelectric-unit temperature feedback control unit 150 acquires the piezoelectric-unit temperature information from the piezoelectric-unit temperature monitor unit 102. The piezoelectric-unit temperature feedback control unit 150 transmits the feedback control signal for keeping the piezoelectric-unit temperature constant to the cooling water temperature control unit 118 of the chiller unit 110 based on the piezoelectric-unit temperature information.

A control target temperature range of the piezoelectric-unit temperature is set to be, for example, 53° C.±0.1° C. When the piezoelectric-unit temperature sensed by the piezoelectric-unit temperature sensor 100 exceeds the control target temperature range, the feedback control signal includes an instruction to change the temperature of cooling water flowing to the piezoelectric unit 88. The temperature of cooling water at the cooling water exit of the chiller unit 110 is changed based on the feedback control signal as appropriate by the cooling water temperature control unit 118 of the chiller unit 110. Through this feedback control using the piezoelectric-unit temperature information, the piezoelectric-unit temperature is maintained at a temperature (for example, a temperature in the range of 53° C.±0.1° C.) in the control target temperature range.

At least while the piezoelectric element 202 is driven, control is performed to maintain the piezoelectric-unit temperature at a constant temperature irrespective of laser irradiation, thereby stabilizing droplet connection.

The temperature of "53° C." is a typical piezoelectric-unit temperature in an operation duration while EUV light is generated. The control target temperature of the piezoelectric-unit temperature may be set to be an appropriate temperature by using the typical temperature at EUV light emission as a guide. The control target temperature of the piezoelectric-unit temperature may be set to be, for example, an appropriate temperature in the range of 20° C. to 70° C. The control target temperature of the piezoelectric-unit temperature may be set to be a temperature selected in the range of 30° C. to 60° C. or a temperature selected in the range of 50° C. to 55° C. The allowable range of "±0.1° C." is a typical temperature range allowed for the control target temperature.

5.3 Effect

According to Embodiment 1, the temperature of cooling water at the cooling water exit of the chiller unit 110 is feedback-controlled with the piezoelectric-unit temperature as a control target, and thus the piezoelectric-unit temperature is maintained constant even when thermal disturbances such as plasma radiation and heat transfer due to gas convection occur.

Accordingly, droplet connection is stabilized, and as a result, EUV light emission is stabilized.

6. Embodiment 2

6.1 Configuration

Figure 4:
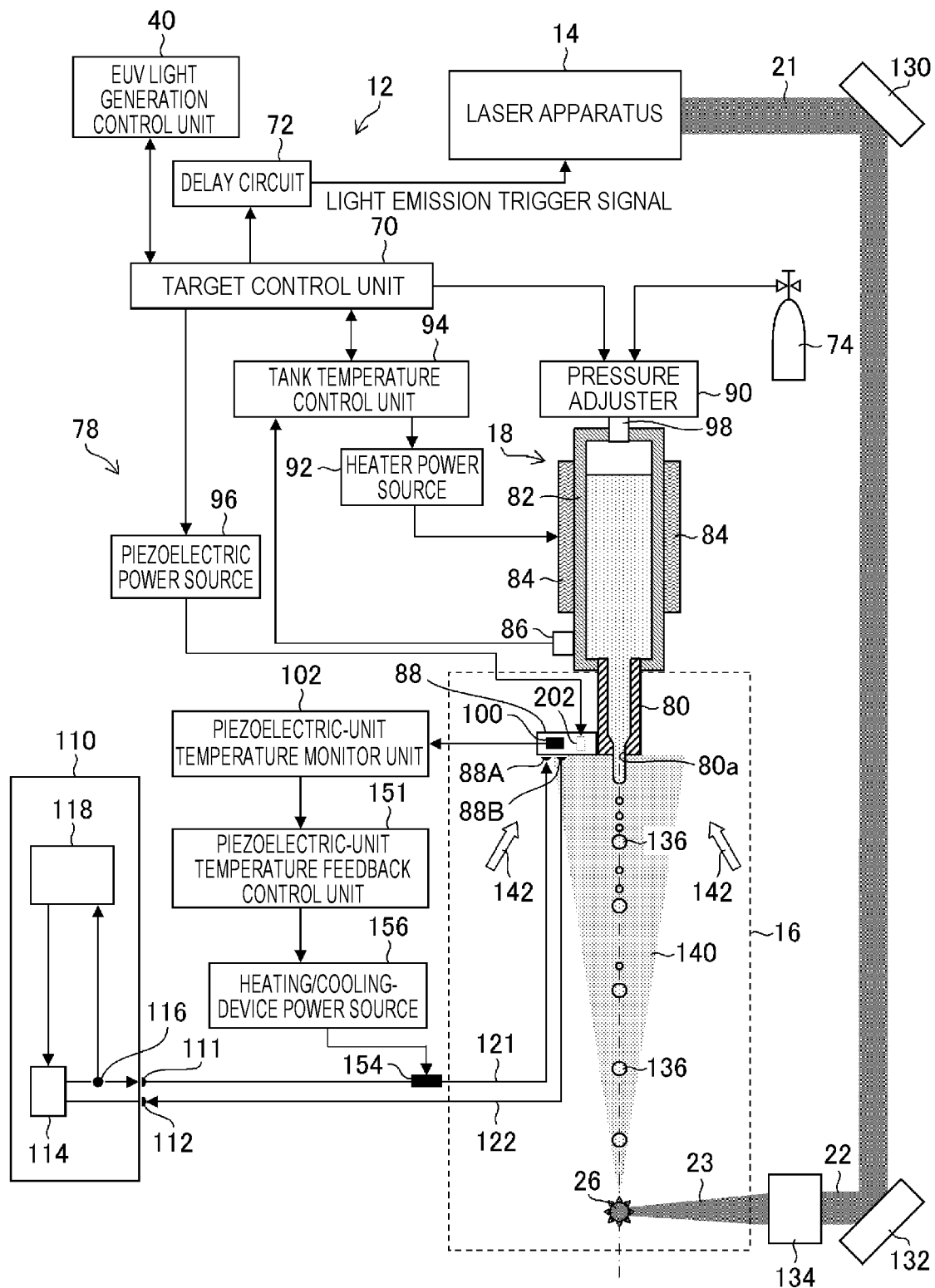
FIG. 4 is a diagram schematically illustrating the configuration of the EUV light generation apparatus including the target supply device according to Embodiment 2.

FIG. 4 schematically illustrates the configuration of the EUV light generation apparatus including the target supply device according to Embodiment 2. The following describes differences from Embodiment 1 illustrated in FIG. 3. Embodiment 2 is different from Embodiment 1 in that the piezoelectric-unit temperature is stabilized by using a heating/cooling device 154 as a temperature adjustment mechanism different from the cooling water heating-cooling unit 114 of the chiller unit 110.

The target supply device 78 illustrated in FIG. 4 includes the heating/cooling device 154 and a heating/cooling-device power source 156 for driving the heating/cooling device 154. The heating/cooling device 154 includes at least one of a heating device and a cooling device. The heating device is typically a heater. The cooling device is typically a Peltier element. The heating/cooling device 154 may be one of a heating device and a cooling device or may be configured as a combination of the devices.

The heating/cooling device 154 is disposed on the cooling water supply flow path 121 from the cooling water exit 111 of the chiller unit 110 to the cooling water introduction port 88A of the piezoelectric unit 88. The heating/cooling device 154 may be disposed outside the chamber 16. FIG. 4 illustrates an example in which the heating/cooling device 154 is disposed outside the chamber 16. The heating/cooling device 154 is desirably disposed outside the chamber 16 and as close to the piezoelectric unit 88 as possible on the cooling water supply flow path 121.

The heating/cooling device 154 is connected with the heating/cooling-device power source 156. The heating/cooling-device power source 156 supplies drive electrical power to the heating/cooling device 154.

The target supply device 78 illustrated in FIG. 4 includes a piezoelectric-unit temperature feedback control unit 151 connected with the heating/cooling-device power source 156. The piezoelectric-unit temperature feedback control unit 151 is connected with the piezoelectric-unit temperature monitor unit 102.

The piezoelectric-unit temperature feedback control unit 151 feedback-controls the temperature of the heating/cooling device 154 through the heating/cooling-device power source 156 based on the piezoelectric-unit temperature information so that the piezoelectric-unit temperature is constant.

6.2 Operation

The piezoelectric-unit temperature feedback control unit 151 acquires the piezoelectric-unit temperature information from the piezoelectric-unit temperature monitor unit 102. The piezoelectric-unit temperature feedback control unit 151 transmits the feedback control signal for keeping the piezoelectric-unit temperature constant to the heating/cooling-device power source 156 based on the piezoelectric-unit temperature information.

The control target temperature range of the piezoelectric-unit temperature is set to be, for example, 53° C.±0.1° C. When the piezoelectric-unit temperature sensed by the piezoelectric-unit temperature sensor 100 exceeds the control target temperature range, the feedback control signal includes an instruction to change the temperature of the heating/cooling device 154. The temperature of the heating/cooling device 154 is changed based on the feedback control signal as appropriate by the heating/cooling-device power source 156. Through this control, the temperature of cooling water in the cooling water supply flow path 121 is changed. In this manner, the piezoelectric-unit temperature is maintained at a temperature (for example, a temperature in the range of 53° C.±0.1° C.) in the control target temperature range.

The exit temperature of the chiller unit 110, which is controlled by the cooling water temperature control unit 118 may be adjusted to a temperature range equivalent to the control target temperature range of the piezoelectric-unit temperature or may be adjusted to a temperature range different from the control target temperature range of the piezoelectric-unit temperature. For example, the control target temperature range of the exit temperature of the chiller unit 110 may be set to be a temperature range lower than the control target temperature range of the piezoelectric-unit temperature. When the control target temperature range of the piezoelectric-unit temperature is 53° C.±0.1° C., the control target temperature range of the exit temperature of the chiller unit 110 may be set to be, for example, 12° C.±0.1° C.

Alternatively, when the control target temperature range of the piezoelectric-unit temperature is 53° C.±0.1° C., the control target temperature range of the exit temperature of the chiller unit 110 may be set to be, for example, 50° C.±0.1° C.

The temperatures of "12° C.±0.1° C." and "50° C.±0.1° C." exemplarily described as the control target temperature range of the exit temperature of the chiller unit 110 are each an exemplary "first temperature". The cooling water heating-cooling unit 114 mounted on the chiller unit 110 is an exemplary "first temperature adjustment mechanism". The heating/cooling device 154 is an exemplary "second temperature adjustment mechanism". The temperature of "53° C.±0.1° C." exemplarily described as the control target temperature range of the piezoelectric-unit temperature is an exemplary "second temperature". The piezoelectric-unit temperature feedback control unit 151 is an exemplary "control unit". The piezoelectric-unit temperature sensor 100 is an exemplary "temperature sensor" configured to detect the temperature of the vibration propagation path.

6.3 Effect

According to Embodiment 2, the temperature of the heating/cooling device 154 is feedback-controlled with the piezoelectric-unit temperature as a control target, and accordingly, the temperature of cooling water in the cooling water supply flow path 121 is changed. Thus, the piezoelectric-unit temperature is maintained constant even when thermal disturbances such as radiation from plasma and heat transfer due to gas convection occur. Accordingly, droplet connection is stabilized, and as a result, EUV light emission is stabilized.

In the configuration of Embodiment 2, temperature control is performed at a position closer to the piezoelectric unit 88 including the vibration propagation path as a target to be maintained at a constant temperature than in the configuration of Embodiment 1, and thus the piezoelectric-unit temperature control can be performed at higher accuracy. In the configuration of Embodiment 2, the piezoelectric-unit temperature is maintained constant at higher accuracy than in the configuration of Embodiment 1 even when thermal disturbances occur, droplet connection is stabilized, and as a result, EUV light emission is stabilized.

Moreover, when the heating/cooling device 154 is disposed outside the chamber 16 as illustrated in FIG. 4, cable wiring for connection with the heating/cooling-device power source 156 and the like are relatively easy.

7. Embodiment 3

7.1 Configuration

Figure 5:
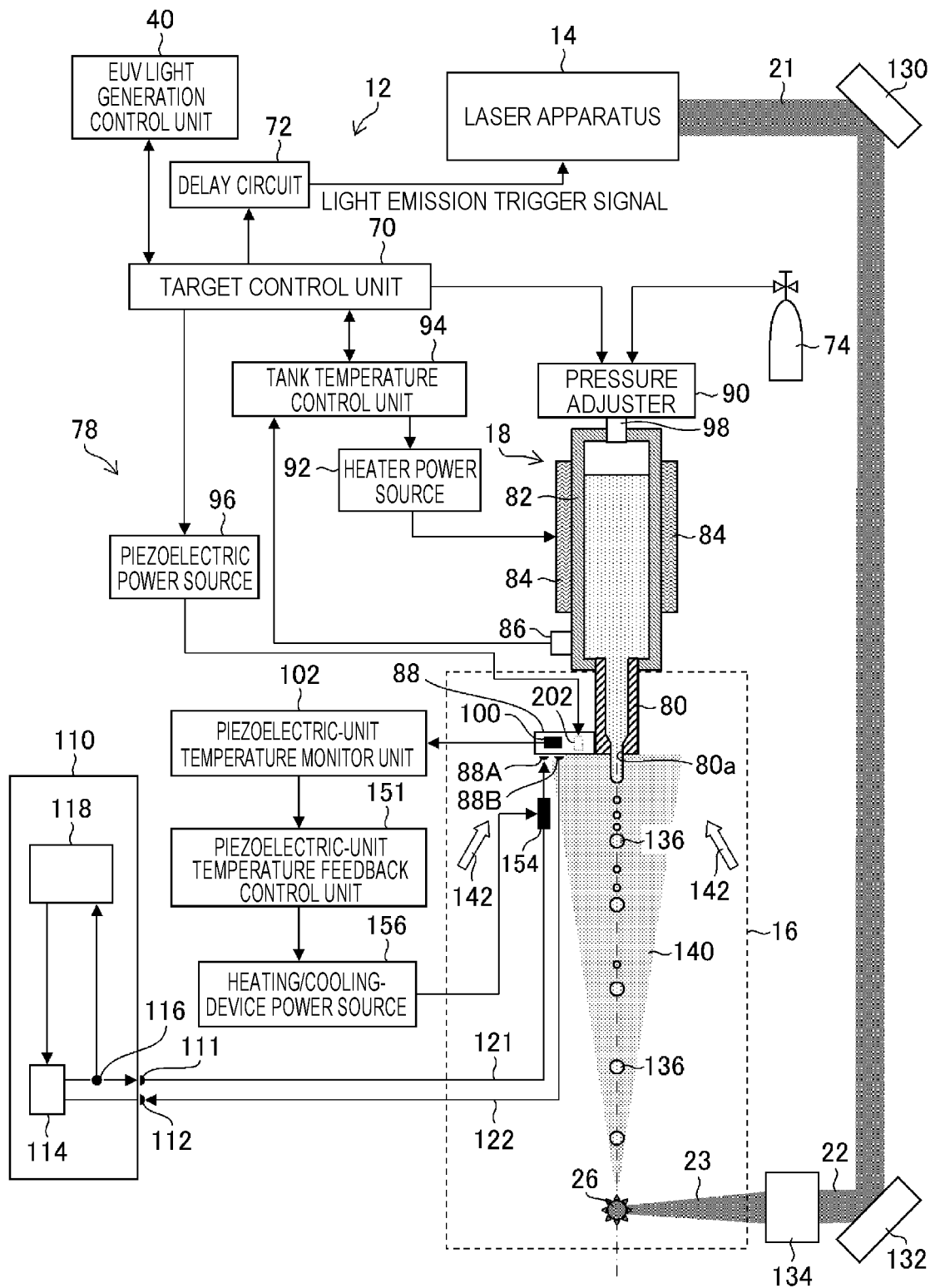
FIG. 5 is a diagram schematically illustrating the configuration of the EUV light generation apparatus including the target supply device according to Embodiment 3.

FIG. 5 schematically illustrates the configuration of the EUV light generation apparatus including the target supply device according to Embodiment 3. The following describes differences from Embodiment 2 illustrated in FIG. 4. The target supply device 78 illustrated in FIG. 5 is different from that of Embodiment 2 in that the heating/cooling device 154 is disposed inside the chamber 16.

7.2 Operation

The operation of the target supply device 78 illustrated in FIG. 5 is same as that in Embodiment 2 illustrated in FIG. 4.

7.3 Effect

According to Embodiment 3, effects same as those of Embodiment 2 can be obtained. In addition, in the configuration of Embodiment 3, temperature control is performed at a position closer to the piezoelectric unit 88 including the vibration propagation path as a target to be maintained at a constant temperature than in the configuration of Embodiment 2, and thus the piezoelectric-unit temperature control can be performed at further higher accuracy. Accordingly, in the configuration of Embodiment 3, the piezoelectric-unit temperature is maintained constant at higher accuracy than in the configuration of Embodiment 2 even when thermal disturbances occur, droplet connection is stabilized, and as a result, EUV light emission is stabilized.

8. Embodiment 4

8.1 Configuration

Figure 6:
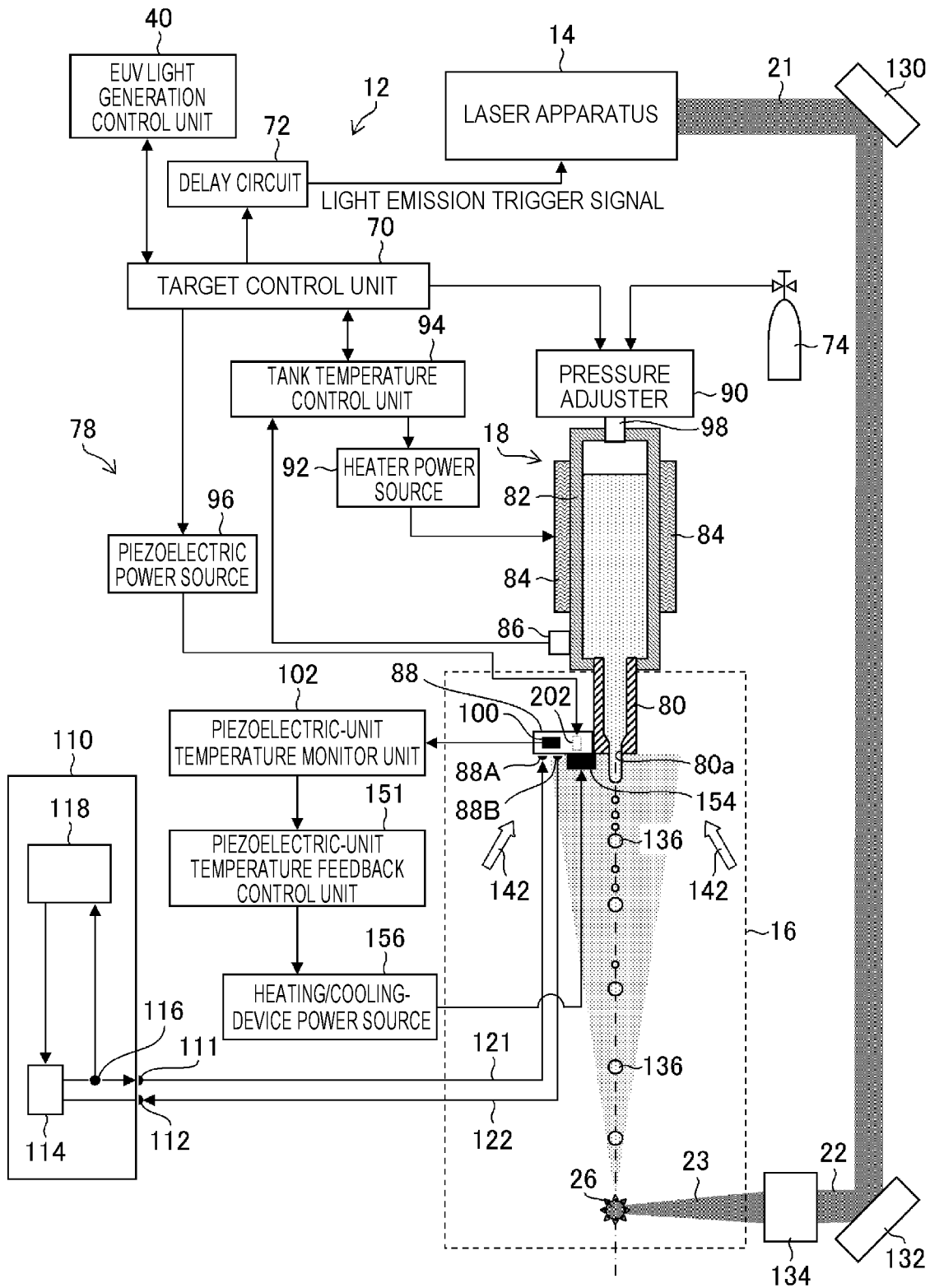
FIG. 6 is a diagram schematically illustrating the configuration of the EUV light generation apparatus including the target supply device according to Embodiment 4.

FIG. 6 schematically illustrates the configuration of the EUV light generation apparatus including the target supply device according to Embodiment 4. The following describes differences from Embodiment 2 illustrated in FIG. 4. The target supply device 78 illustrated in FIG. 6 is different from that in Embodiment 2 in that the heating/cooling device 154 is disposed on the surface of the piezoelectric unit 88 or inside the piezoelectric unit 88.

8.2 Operation

In the target supply device 78 illustrated in FIG. 6, the heating/cooling device 154 disposed on the piezoelectric unit 88 directly heats or cools the piezoelectric unit 88. The other operation is same as that of Embodiment 2. In this manner, the piezoelectric-unit temperature is maintained at a temperature (for example, a temperature in the range of 53° C.±0.1° C.) in the control target temperature range.

8.3 Effect

According to Embodiment 4, effects same as those of Embodiment 2 can be obtained. In addition, in the configuration of Embodiment 4, temperature control is performed at a position closer to the piezoelectric unit 88 including the vibration propagation path as a target to be maintained at a constant temperature than in the configuration of Embodiment 2 and the configuration of Embodiment 3, and thus the piezoelectric-unit temperature control can be performed at further higher accuracy. Accordingly, in the configuration of Embodiment 4, the piezoelectric-unit temperature is maintained constant at higher accuracy than in the configurations of Embodiment 1 to 3 even when thermal disturbances occur, droplet connection is stabilized, and as a result, EUV light emission is stabilized.

9. Embodiment 5

9.1 Configuration

Figure 7:
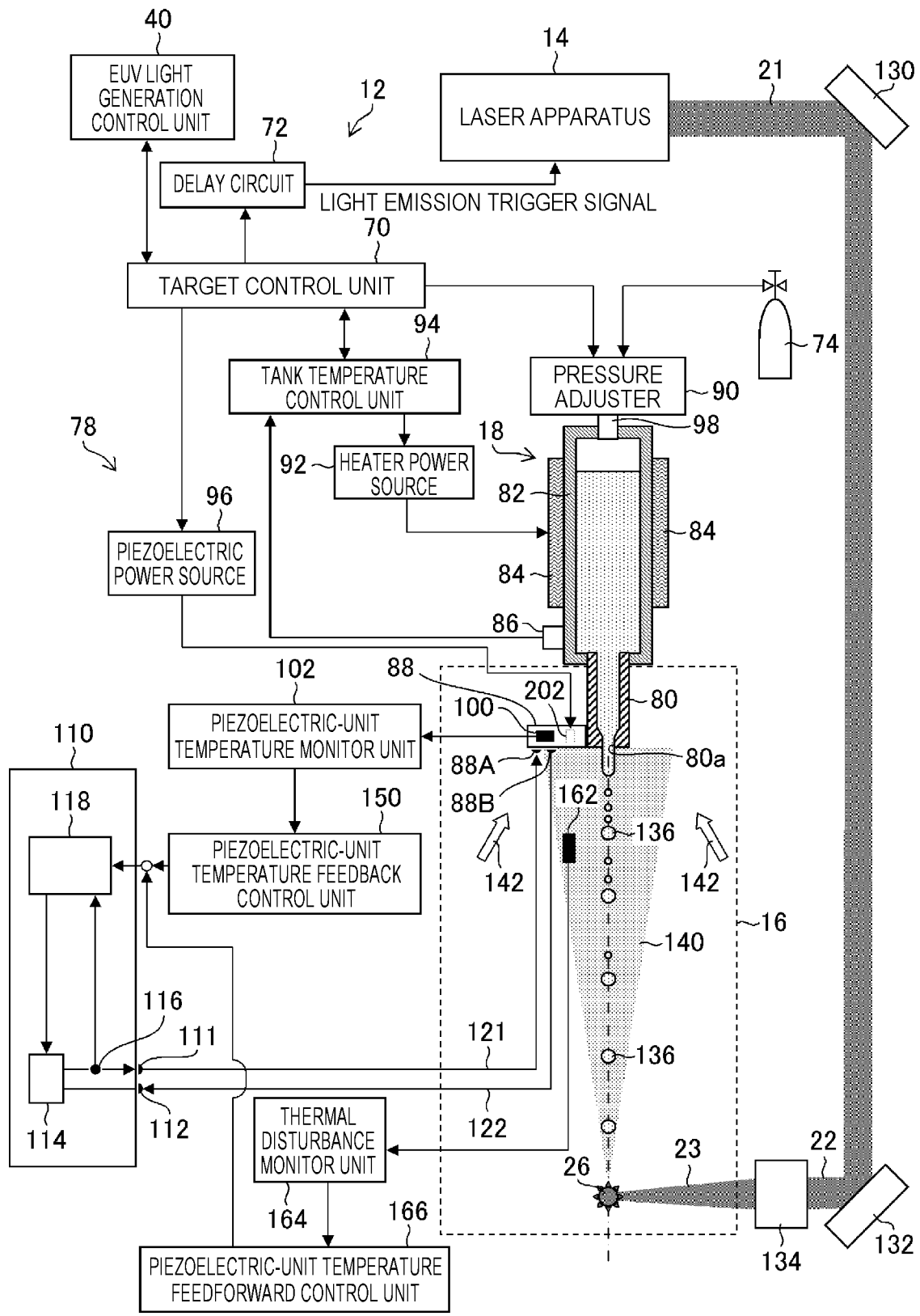
FIG. 7 is a diagram schematically illustrating the configuration of the EUV light generation apparatus including the target supply device according to Embodiment 5.

FIG. 7 schematically illustrates the configuration of the EUV light generation apparatus including the target supply device according to Embodiment 5. The following describes differences from Embodiment 1 illustrated in FIG. 3. In Embodiment 5, a mechanism configured to feedforward-control the piezoelectric-unit temperature is provided in addition to the piezoelectric-unit temperature feedback control mechanism described in Embodiment 1.

The target supply device 78 illustrated in FIG. 7 includes a thermal disturbance sensor 162, a thermal disturbance monitor unit 164 configured to monitor thermal disturbance information of the thermal disturbance sensor 162, and the piezoelectric-unit temperature feedforward control unit 166 in addition to the configuration of Embodiment 1. The thermal disturbance sensor 162 measures thermal disturbances inside the chamber 16. The thermal disturbances include at least one of radiation heat due to the radiation 140 from plasma and convection heat due to heat transfer of the gas convection 142.

The thermal disturbance sensor 162 may be an energy detector configured to detect energy radiated to the piezoelectric unit 88. The thermal disturbance sensor 162 may be a sensor configured to detect heat or a sensor configured to detect optical energy. The sensor configured to detect heat may be, for example, a thermocouple, a thermoelectric element, or a platinum resistor body. The sensor configured to detect optical energy may be, for example, a photodiode, an EUV energy detector, an infrared energy detector, or a pyroelectric element.

Temperature detection by using a thermocouple or the like is included in the concept of heat amount (thermal energy) detection. In other words, a sensor configured to detect heat as a temperature is included in the concept of a heat amount detector configured to detect a heat amount.

The thermal disturbance sensor 162 is disposed in the radiation range of the radiation 140 from plasma. The thermal disturbance sensor 162 is desirably disposed closer to the piezoelectric unit 88 in the radiation range of plasma.

The thermal disturbance sensor 162 is connected with the thermal disturbance monitor unit 164. The thermal disturbance monitor unit 164 is connected with the piezoelectric-unit temperature feedforward control unit 166. The piezoelectric-unit temperature feedforward control unit 166 feedforward-controls the exit temperature of the chiller unit 110 based on the thermal disturbance information from the thermal disturbance monitor unit 164 so that the piezoelectric-unit temperature is constant. The piezoelectric-unit temperature feedforward control unit 166 acquires the thermal disturbance information from the thermal disturbance monitor unit 164 and outputs a feedforward control signal to the cooling water temperature control unit 118 of the chiller unit 110. The piezoelectric-unit temperature feedforward control unit 166 does not necessarily need to acquire the thermal disturbance information from the thermal disturbance monitor unit 164, but may acquire the thermal disturbance information directly from the thermal disturbance sensor 162.

9.2 Operation

As described in Embodiment 1, the piezoelectric-unit temperature feedback control unit 150 feedback-controls the piezoelectric-unit temperature as a control target based on the piezoelectric-unit temperature information. In addition, in the target supply device 78 illustrated in FIG. 7, thermal disturbances in the chamber 16 are detected by the thermal disturbance sensor 162 and monitored by the thermal disturbance monitor unit 164.

The piezoelectric-unit temperature feedforward control unit 166 transmits the feedforward control signal for keeping the piezoelectric-unit temperature constant to the cooling water temperature control unit 118 of the chiller unit 110 based on the thermal disturbance information from the thermal disturbance monitor unit 164.

The cooling water temperature control unit 118 of the chiller unit 110 controls drive of the cooling water heating-cooling unit 114 and changes the temperature of cooling water at the cooling water exit 111 of the chiller unit 110 as appropriate.

The cooling water heating-cooling unit 114 is an exemplary "temperature adjustment mechanism" configured to adjust the temperature of a vibration propagation path component to a specified control temperature. The control target temperature (for example, 53° C.) for keeping the piezoelectric-unit temperature constant is an exemplary "specified control temperature". The piezoelectric-unit temperature feedback control unit 150 is an exemplary "first control unit". The piezoelectric-unit temperature feedforward control unit 166 is an exemplary "control unit" configured to change a control temperature based on an output from an energy detector. The piezoelectric-unit temperature feedforward control unit 166 is an exemplary "second control unit".

9.3 Effect

According to Embodiment 5, when thermal disturbances occur, the temperature of cooling water at the cooling water exit 111 of the chiller unit 110 is feedforward-controlled with the piezoelectric-unit temperature as a control target. Accordingly, variation of the piezoelectric-unit temperature at the initial stage of thermal disturbance occurrence, which cannot be reduced only by feedback control, is reduced.

According to Embodiment 5, the piezoelectric-unit temperature is maintained constant at higher accuracy than in a case (Embodiment 1) with feedback control only, droplet connection is stabilized, and as a result, EUV light emission is stabilized.

10. Embodiment 6

10.1 Configuration

Figure 8:
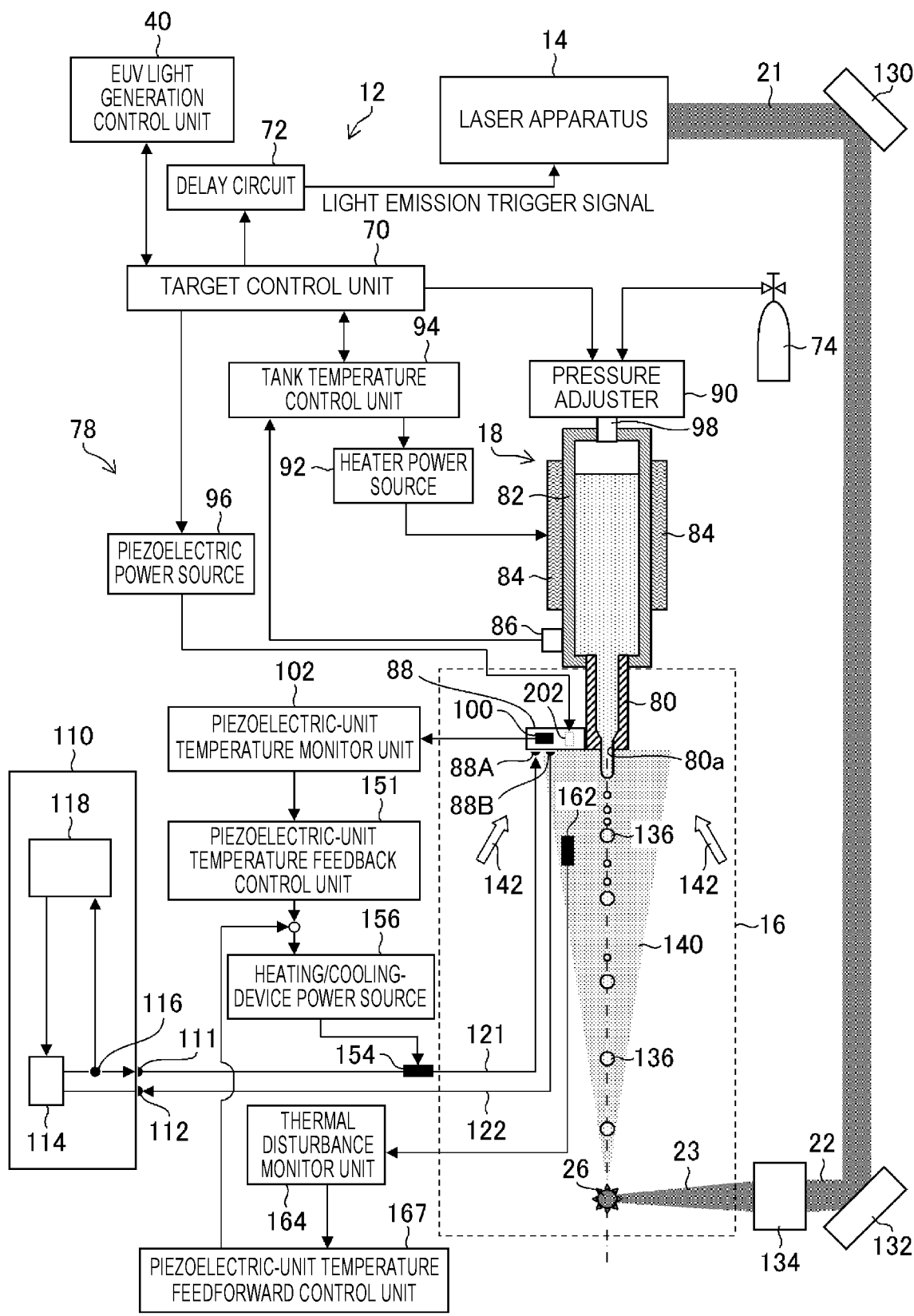
FIG. 8 is a diagram schematically illustrating the configuration of the EUV light generation apparatus including the target supply device according to Embodiment 6.

FIG. 8 schematically illustrates the configuration of the EUV light generation apparatus including the target supply device according to Embodiment 6. The following describes differences from Embodiment 2 illustrated in FIG. 4. In Embodiment 6, a piezoelectric-unit temperature feedforward control mechanism is provided in addition to the configuration including the piezoelectric-unit temperature feedback control mechanism described in Embodiment 2.

The target supply device 78 illustrated in FIG. 8 includes the thermal disturbance sensor 162, the thermal disturbance monitor unit 164, and a piezoelectric-unit temperature feedforward control unit 167 in addition to the configuration of Embodiment 2. The thermal disturbance sensor 162 and the thermal disturbance monitor unit 164 have the configurations described in Embodiment 5 (FIG. 7).

The piezoelectric-unit temperature feedforward control unit 167 in FIG. 8 feedforward-controls the temperature of the heating/cooling device 154 through the heating/cooling-device power source 156 based on the thermal disturbance information so that the piezoelectric-unit temperature is constant.

10.2 Operation

The piezoelectric-unit temperature feedback control unit 151 feedback-controls the piezoelectric-unit temperature as a control target based on the piezoelectric-unit temperature information. In addition, in the target supply device 78 illustrated in FIG. 8, thermal disturbances in the chamber 16 are detected by the thermal disturbance sensor 162 and monitored by the thermal disturbance monitor unit 164.

The piezoelectric-unit temperature feedforward control unit 167 transmits the feedforward control signal for keeping the piezoelectric-unit temperature constant to the heating/cooling-device power source 156 based on the thermal disturbance information obtained from the thermal disturbance monitor unit 164. The temperature of the heating/cooling device 154 is changed as appropriate by the heating/cooling-device power source 156, and accordingly, the temperature of cooling water in the cooling water supply flow path 121 is changed.

The piezoelectric-unit temperature feedback control unit 151 is an exemplary "first control unit". The piezoelectric-unit temperature feedforward control unit 167 is an exemplary "control unit" configured to change a control temperature based on an output from an energy detector. The piezoelectric-unit temperature feedforward control unit 167 is an exemplary "second control unit".

10.3 Effect

According to Embodiment 6, when thermal disturbances occur, the temperature of cooling water in a cooling water flow path closer to the piezoelectric unit 88 than in Embodiment 5 (FIG. 7) is feedforward-controlled with the piezoelectric-unit temperature as a control target. Accordingly, variation of the piezoelectric-unit temperature is further reduced than in Embodiment 5. According to Embodiment 6, the piezoelectric-unit temperature is maintained constant at higher accuracy than in Embodiment 5, droplet connection is stabilized, and as a result, EUV light emission is stabilized.

11. Embodiment 7

11.1 Configuration

Figure 9:
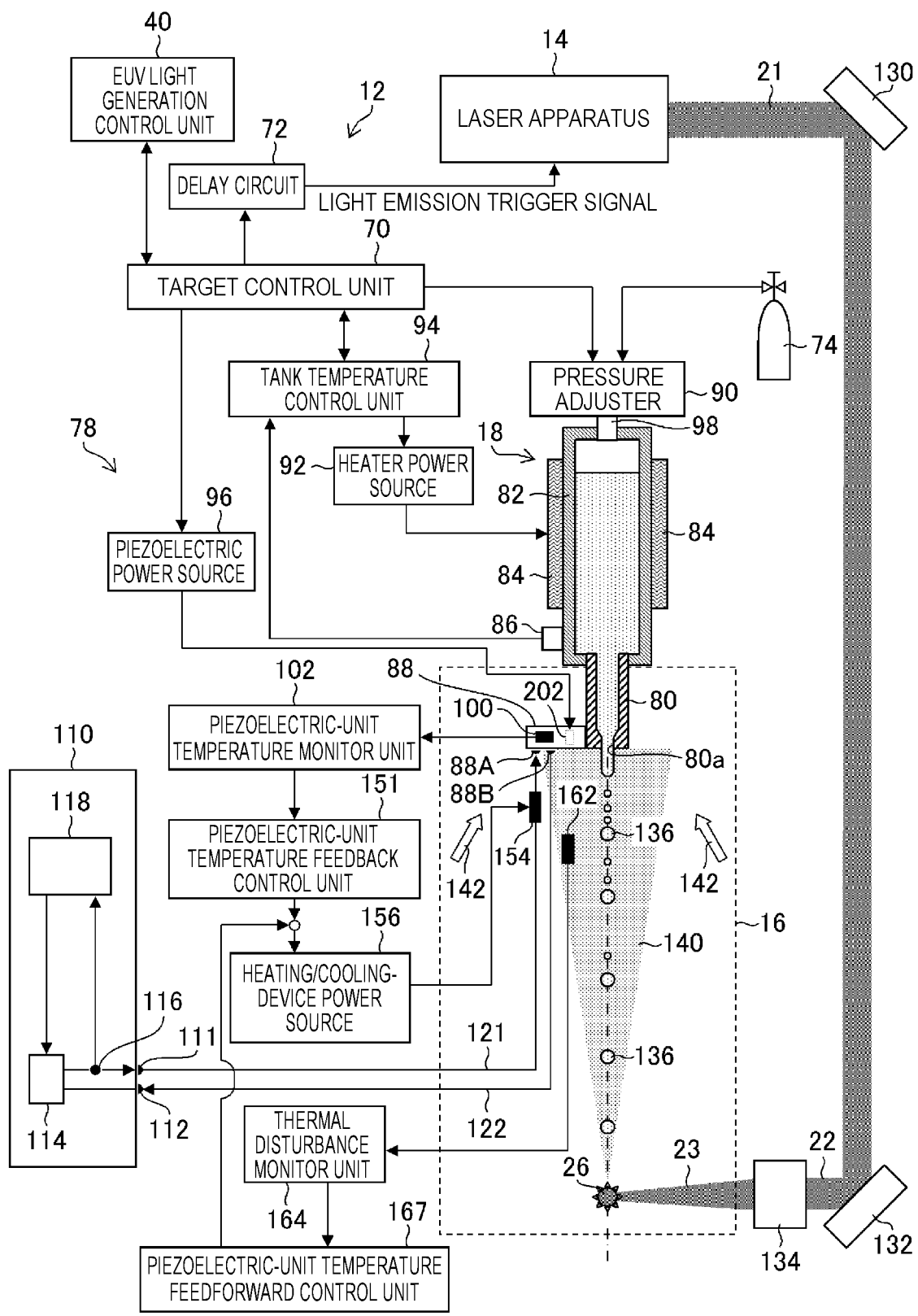
FIG. 9 is a diagram schematically illustrating the configuration of the EUV light generation apparatus including the target supply device according to Embodiment 7.

FIG. 9 schematically illustrates the configuration of the EUV light generation apparatus including the target supply device according to Embodiment 7. The following describes differences from Embodiment 6 illustrated in FIG. 8. The target supply device 78 according to Embodiment 7 illustrated in FIG. 9 is different from that in Embodiment 6 in that the heating/cooling device 154 is disposed inside the chamber 16.

11.2 Operation

The operation of the target supply device 78 illustrated in FIG. 9 is same as that in Embodiment 6 illustrated in FIG. 8.

11.3 Effect

According to Embodiment 7, effects same as those of Embodiment 6 can be obtained. In addition, in the configuration of Embodiment 7, temperature control is performed at a position closer to the piezoelectric unit 88 as a target to be maintained at a constant temperature than in the configuration of Embodiment 6, and thus the piezoelectric-unit temperature control can be performed at higher accuracy. Accordingly, in the configuration of Embodiment 7, the piezoelectric-unit temperature is maintained constant at higher accuracy than in the configuration of Embodiment 6 even when thermal disturbances occur, droplet connection is stabilized, and as a result, EUV light emission is stabilized.

12. Embodiment 8

12.1 Configuration

Figure 10:
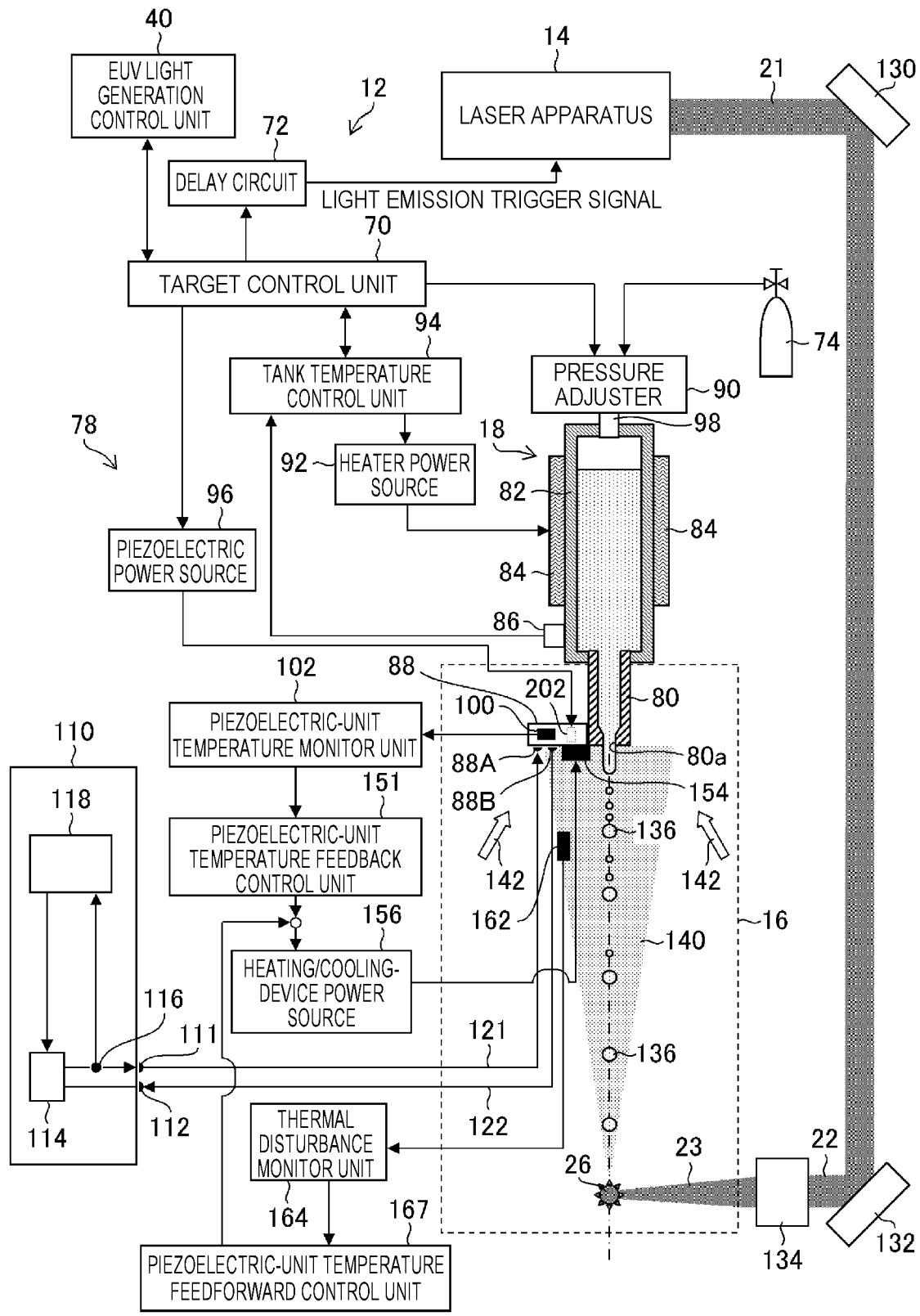
FIG. 10 is a diagram schematically illustrating the configuration of the EUV light generation apparatus including the target supply device according to Embodiment 8.

FIG. 10 schematically illustrates the configuration of the EUV light generation apparatus including the target supply device according to Embodiment 8. The following describes differences from Embodiment 6 illustrated in FIG. 8. The target supply device 78 according to Embodiment 8 illustrated in FIG. 10 is different from that of Embodiment 6 in that the heating/cooling device 154 is disposed on the surface of the piezoelectric unit 88 or inside the piezoelectric unit 88.

12.2 Operation

In the target supply device 78 illustrated in FIG. 10, the heating/cooling device 154 disposed on the piezoelectric unit 88 directly heats or cools the piezoelectric unit 88. The other operation is same as that of Embodiment 6.

12.3 Effect

According to Embodiment 8, effects same as those of Embodiment 6 can be obtained. In addition, in the configuration of Embodiment 8, temperature control is performed at a position closer to the piezoelectric unit 88 as a target to be maintained at a constant temperature than in the configurations of Embodiments 6 and 7, and thus the piezoelectric-unit temperature control can be performed at higher accuracy. Since feedforward control using the thermal disturbance information is performed in addition to feedback control, variation of the piezoelectric-unit temperature is further reduced than in the configuration of Embodiment 4. In the configuration of Embodiment 8, the piezoelectric-unit temperature is maintained constant at higher accuracy than in the configurations of Embodiments 4 to 7 even when thermal disturbances occur. Accordingly, droplet connection is stabilized, and as a result, EUV light emission is stabilized.

13. Embodiment 9

13.1 Configuration

Figure 11:
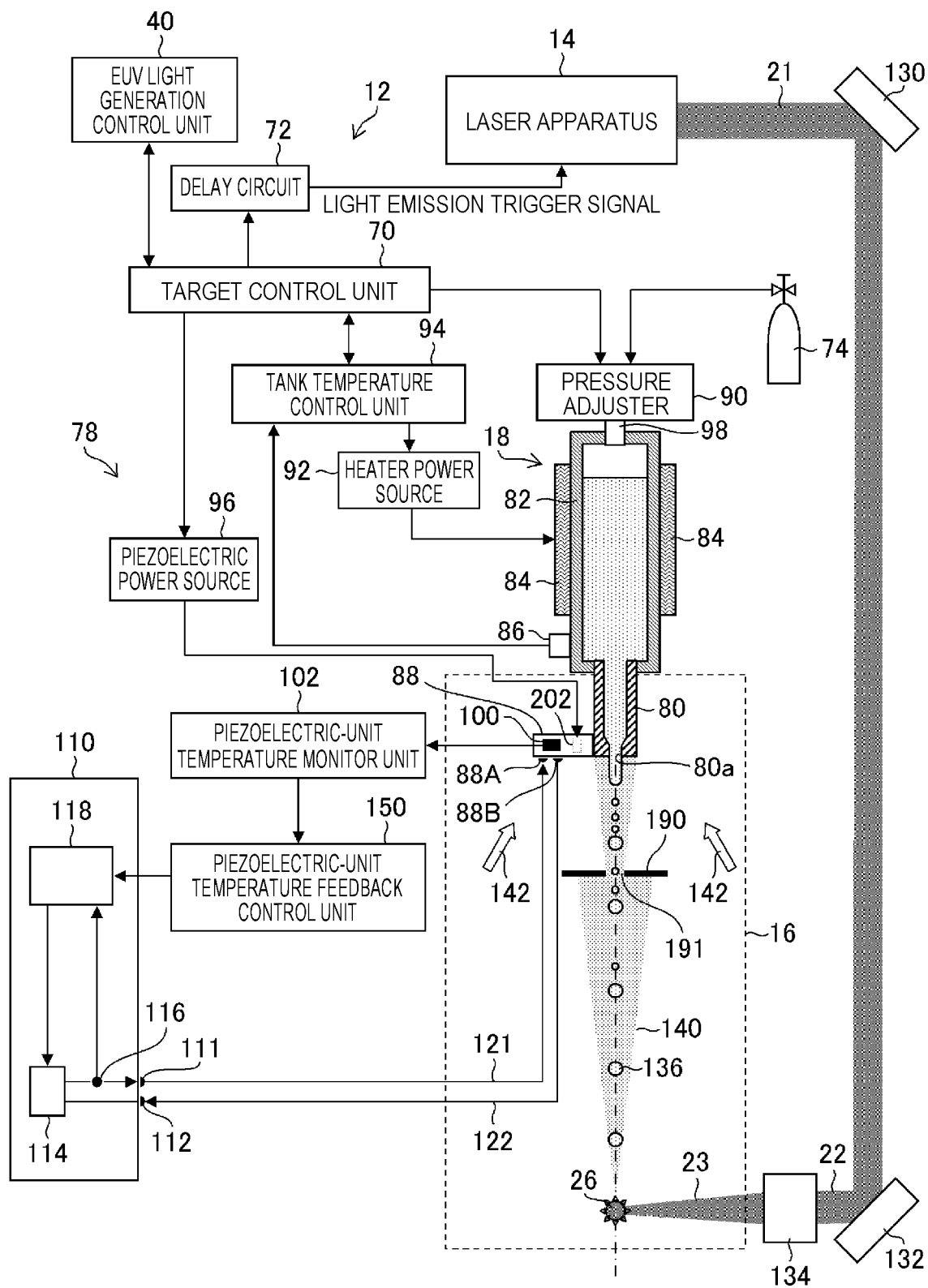
FIG. 11 is a diagram schematically illustrating the configuration of the EUV light generation apparatus including the target supply device according to Embodiment 9.

FIG. 11 schematically illustrates the configuration of the EUV light generation apparatus including the target supply device according to Embodiment 9. The following describes differences from Embodiment 1 illustrated in FIG. 3. The target supply device illustrated in FIG. 11 includes, in addition to the configuration of Embodiment 1, a plasma shielding plate 190 that restricts a range (area) in which a vibration propagation path component such as the piezoelectric unit 88 is exposed to radiation from plasma.

The plasma shielding plate 190 is disposed on the droplet trajectory from the nozzle 80 to the plasma generation region 26. The plasma shielding plate 190 has a small hole 191 through which the droplet 136 passes.

13.2 Operation

The plasma shielding plate 190 reduces radiation from plasma, which reaches a component such as the piezoelectric unit 88 forming the vibration propagation path. As clearly understood from comparison with FIG. 3, the plasma radiation exposure area in Embodiment 9 illustrated in FIG. 11 is smaller than the plasma radiation exposure area when no plasma shielding plate 190 is disposed.

When the plasma shielding plate 190 is disposed, influence of plasma radiation on thermal disturbances can be reduced, and variation of the piezoelectric-unit temperature attributable to thermal disturbances can be reduced as compared to the configuration in FIG. 3.

The operation of feedback control involving the piezoelectric-unit temperature feedback control unit 150 is same as that in Embodiment 1.

13.3 Effect

With the target supply device 78 according to Embodiment 9, the amount of part (in this example, radiation from plasma) of thermal disturbances as a temperature variation factor that reaches a vibration propagation path component such as the piezoelectric unit 88 is reduced, and accordingly, variation of the temperature of the piezoelectric unit 88 is reduced. According to Embodiment 9, since the amount of radiation from plasma, which reaches a vibration propagation path component such as the piezoelectric unit 88 is reduced as compared to a form in which no plasma shielding plate 190 is disposed, feedback control is performed at higher accuracy, and thus the piezoelectric-unit temperature is further stabilized. Accordingly, droplet connection is stabilized, and as a result, EUV light emission is stabilized.

14. Another Form Including Plasma Shielding Plate

FIG. 11 illustrates the example in which the plasma shielding plate 190 is provided in addition to the configuration of Embodiment 1, but similarly to FIG. 11, the plasma shielding plate 190 may be provided in addition to the configurations of Embodiments 2 to 8. A form in which the plasma shielding plate 190 is provided in addition to the configuration of Embodiment 5 will be described below as Embodiment 10.

15. Embodiment 10

15.1 Configuration

Figure 12:
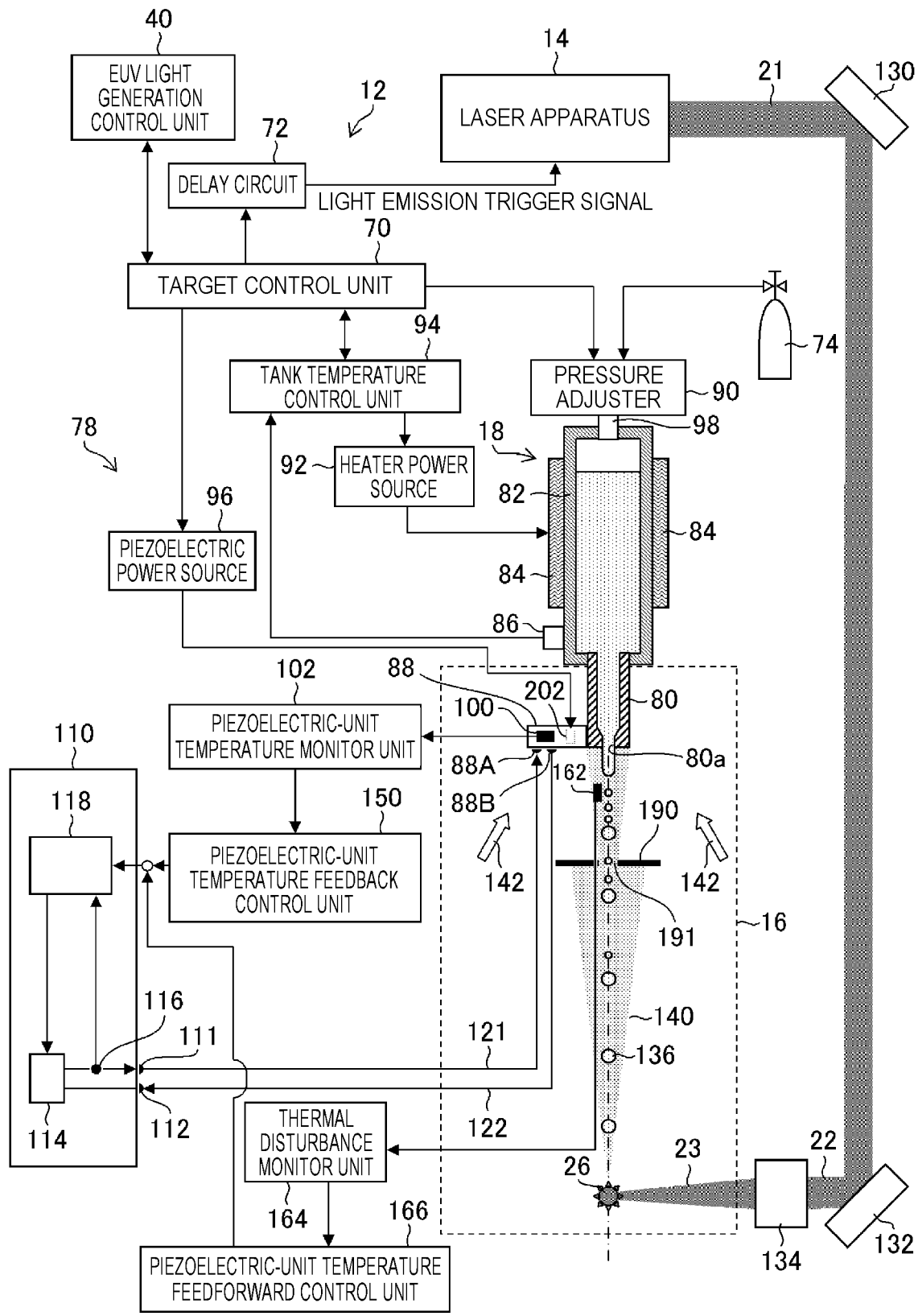
FIG. 12 is a diagram schematically illustrating the configuration of the EUV light generation apparatus including the target supply device according to Embodiment 10.

FIG. 12 schematically illustrates the configuration of the EUV light generation apparatus including the target supply device according to Embodiment 10. The following describes differences from Embodiment 5 illustrated in FIG. 7.

The target supply device illustrated in FIG. 12 includes, in addition to the configuration of Embodiment 5, the plasma shielding plate 190 that restricts a range (area) in which a vibration propagation path component such as the piezoelectric unit 88 is exposed to the radiation 140 from plasma.

The plasma shielding plate 190 is disposed on the droplet trajectory from the nozzle 80 to the plasma generation region 26. The plasma shielding plate 190 has the small hole 191 through which the droplet 136 passes.

The thermal disturbance sensor 162 is disposed in the radiation range of plasma. The thermal disturbance sensor 162 may be disposed between the plasma generation region 26 and the plasma shielding plate 190 but is preferably disposed between the plasma shielding plate 190 and a vibration propagation path component such as the piezoelectric unit 88 as illustrated in FIG. 11.

15.2 Operation

The plasma shielding plate 190 functions as described in Embodiment 9. The plasma shielding plate 190 reduces radiation from plasma, which reaches a vibration propagation path component such as the piezoelectric unit 88.

The operation of feedforward control involving the thermal disturbance sensor 162, the thermal disturbance monitor unit 164, and the piezoelectric-unit temperature feedforward control unit 166 is same as that in Embodiment 5.

15.3 Effect

According to Embodiment 10, since the amount of radiation from plasma, which reaches a vibration propagation path component such as the piezoelectric unit 88 is reduced as compared to a form in which no plasma shielding plate 190 is disposed, feedback control and feedforward control are performed at higher accuracy, and thus the piezoelectric-unit temperature is further stabilized. Accordingly, droplet connection is stabilized, and as a result, EUV light emission is stabilized.

16. Specific Example of Piezoelectric Unit 16.1 Configuration

Figure 13:
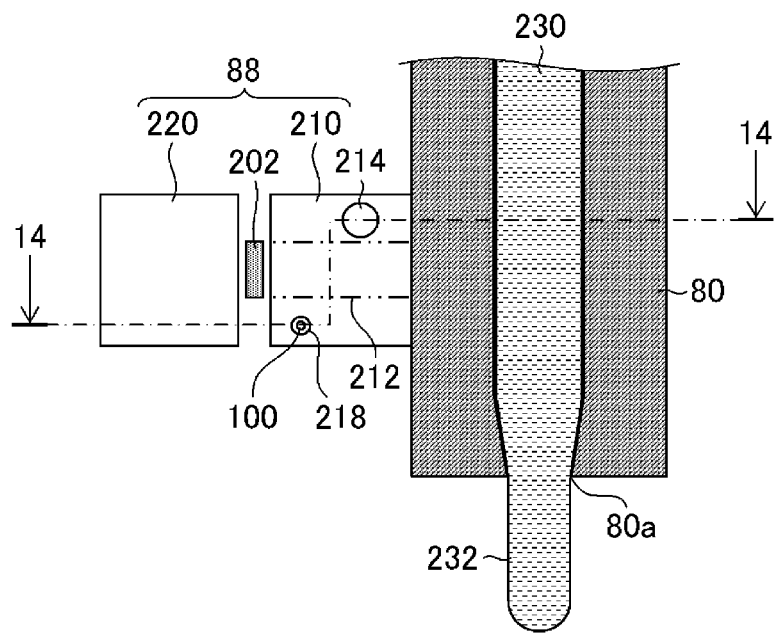
FIG. 13 is a cross-sectional view illustrating the configuration of a piezoelectric unit.
Figure 13:
Figure 13:
Figure 14:
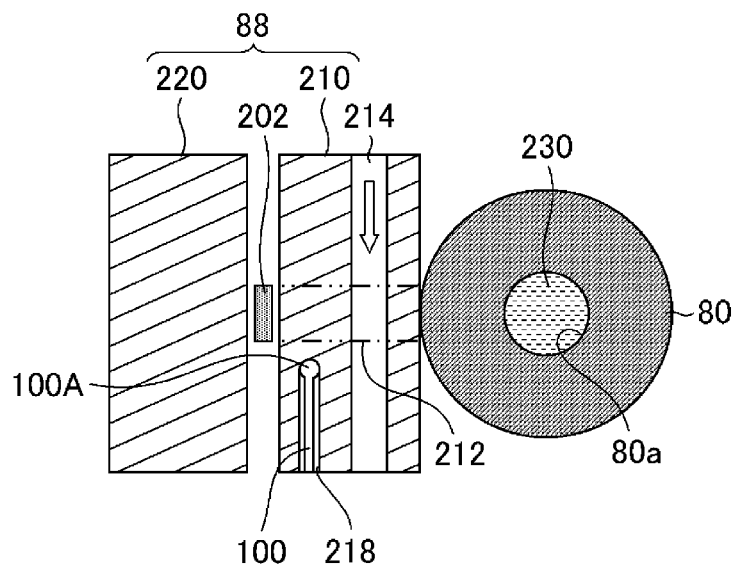
FIG. 14 is a cross-sectional view of the piezoelectric unit illustrated in FIG. 13 taken along line 14-14.

FIG. 13 is a longitudinal sectional view of the nozzle 80 and the piezoelectric unit 88 taken along a plane including the center axis of the nozzle 80. FIG. 14 is a cross-sectional view taken along line 14-14 in FIG. 13. FIG. 14 corresponds to a transverse sectional view of the nozzle 80 and the piezoelectric unit 88 taken along a surface orthogonal to the center axis of the nozzle 80.

The piezoelectric unit 88 includes the piezoelectric element 202, a first component 210, and a second component 220. The piezoelectric unit 88 has a configuration in which the piezoelectric element 202 is sandwiched between the first component 210 and the second component 220. The first component 210 is fixed to an outer side surface part of the nozzle 80. The first component 210 transfers vibration of the piezoelectric element 202 to the nozzle 80. The second component 220 is fastened to the first component 210 by using a bolt (not illustrated). The second component 220 presses the piezoelectric element 202 against the first component 210 so that vibration of the piezoelectric element 202 can be easily transferred to the first component 210.

A range illustrated with dashed and double-dotted lines in the first component 210 in FIG. 13 corresponds to a vibration propagation path 212 of the piezoelectric element 202. The vibration propagation path 212 is a region that overlaps the region of the piezoelectric element 202 when the region of the piezoelectric element 202 is viewed in the direction from the piezoelectric element 202 toward the nozzle 80, in other words, the vibration propagation path 212 is a region directly below the piezoelectric element 202.

The first component 210 is provided with a cooling water path 214. Cooling water flows through the cooling water path 214 of the first component 210 to prevent the piezoelectric element 202 from being excessively heated due to heat transfer from the nozzle 80. The white arrow in FIG. 14 represents flow of the cooling water.

The piezoelectric-unit temperature sensor 100 is disposed at the first component 210. The piezoelectric-unit temperature sensor 100 measures the temperature inside the first component 210, not at the surface of the first component 210. The first component 210 is provided with a sensor insertion hole 218 into which the piezoelectric-unit temperature sensor 100 is inserted. The sensor insertion hole 218 reaches the vicinity of the vibration propagation path 212 inside the first component 210. The piezoelectric-unit temperature sensor 100 is inserted into the sensor insertion hole 218 provided at the first component 210. The piezoelectric-unit temperature sensor 100 and the cooling water path 214 are desirably not disposed in the vibration propagation path 212. This is not to encumber vibration transfer. As illustrated in FIG. 13, the piezoelectric-unit temperature sensor 100 and the cooling water path 214 are disposed outside the vibration propagation path 212, not in the vibration propagation path 212.

A temperature sensing unit 100A of the piezoelectric-unit temperature sensor 100 is preferably disposed as close to the vibration propagation path 212 as possible. This is to measure the temperature at a position extremely close to the vibration propagation path 212.

The cooling water path 214 is preferably provided at a position closer to the piezoelectric element 202 in the first component 210, and the piezoelectric-unit temperature sensor 100 may be provided at a position closer to the piezoelectric element 202 in the first component 210.

The configuration illustrated in FIGS. 13 and 14 is applicable to Embodiments 1 to 10.

When the pressure in the tank 82 is adjusted to a predetermined pressure by the pressure adjuster 90, liquid tin 230 is supplied into the nozzle 80 and a jet 232 of the liquid tin 230 is ejected through the nozzle hole 80a at a predetermined speed as illustrated in FIG. 13.

The piezoelectric element 202 vibrates when a piezoelectric drive signal is applied from the piezoelectric power source 96 to the piezoelectric element 202. The vibration of the piezoelectric element 202 propagates to the nozzle hole 80a through the first component 210, and regular vibration that promotes droplet generation and connection is provided to the jet 232 of the liquid tin 230 output through the nozzle hole 80a. Accordingly, the droplet 136 is generated.

16.2 Method 1 of Fixing Piezoelectric-Unit Temperature Sensor

Figure 15:
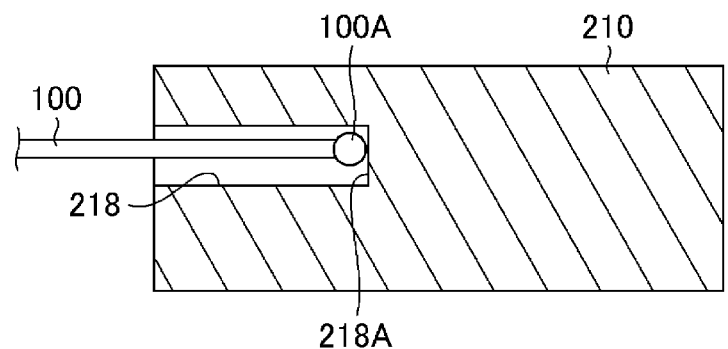
FIG. 15 is a cross-sectional view schematically illustrating a first exemplary method of fixing a piezoelectric-unit temperature sensor.
Figure 16:
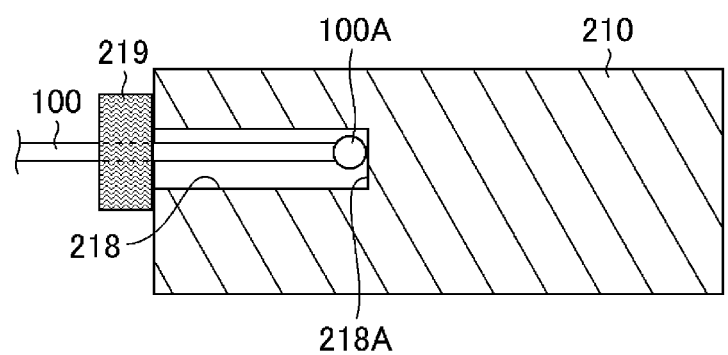
FIG. 16 is a cross-sectional view schematically illustrating the first exemplary method of fixing the piezoelectric-unit temperature sensor.

FIGS. 15 and 16 are cross-sectional views schematically illustrating a first exemplary method of fixing the piezoelectric-unit temperature sensor. The first component 210 has the sensor insertion hole 218. The piezoelectric-unit temperature sensor 100 is inserted into the sensor insertion hole 218, and the temperature sensing unit 100A is pressed against a bottom part 218A of the sensor insertion hole 218.

Then, the piezoelectric-unit temperature sensor 100 may be clamped by using a clamp member 219 as illustrated in FIG. 16 so that the temperature sensing unit 100A maintains the state of contact with the bottom part 218A of the sensor insertion hole 218.

16.3 Method 2 of Fixing Piezoelectric-Unit Temperature Sensor

Figure 17:
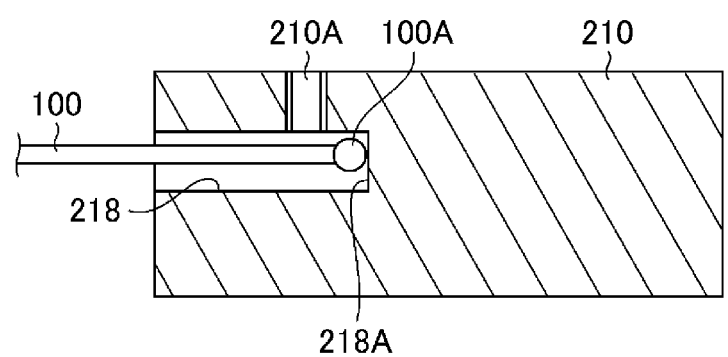
FIG. 17 is a cross-sectional view schematically illustrating a second exemplary method of fixing the piezoelectric-unit temperature sensor.
Figure 18:
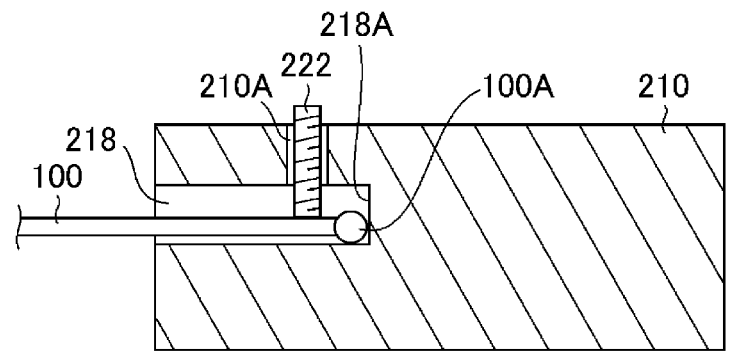
FIG. 18 is a cross-sectional view schematically illustrating the second exemplary method of fixing the piezoelectric-unit temperature sensor.

FIGS. 17 and 18 are cross-sectional views schematically illustrating a second exemplary method of fixing the piezoelectric-unit temperature sensor. As illustrated in FIG. 17, the first component 210 may be provided with a fastening-bolt screw hole 210A, and the piezoelectric-unit temperature sensor 100 may be fixed to the screw hole 210A by using a fastening bolt 222 (refer to FIG. 18). Specifically, the piezoelectric-unit temperature sensor 100 may be fixed by fastening the fastening bolt 222 into the screw hole 210A while the temperature sensing unit 100A of the piezoelectric-unit temperature sensor 100 is pressed against the bottom part 218A of the sensor insertion hole 218.

16.4 Operation

The piezoelectric-unit temperature sensor 100 having the configuration exemplarily illustrated in FIGS. 13 to 18 measures the temperature at a position extremely close to the vibration propagation path 212 of the piezoelectric unit 88.

The piezoelectric unit 88 is an exemplary "vibration unit". The second component 220 of the piezoelectric unit 88 is an exemplary "vibration propagation path component".

16.5 Effect

With the configuration exemplarily illustrated in FIGS. 13 to 18, the temperature at a position extremely close to the vibration propagation path 212 of the piezoelectric unit 88 can be measured as compared to a form in which the piezoelectric-unit temperature sensor is disposed on the component surface of the piezoelectric unit 88. Accordingly, the deviation of a detection temperature (measurement temperature) detected by the piezoelectric-unit temperature sensor 100 from the actual temperature of the vibration propagation path 212 decreases, and the piezoelectric-unit temperature control can be performed at higher accuracy.

17. Laser Apparatus

The laser apparatus 14 may include a pre-pulse laser apparatus configured to output a pre-pulse laser beam, and a main pulse laser apparatus configured to output a main pulse laser beam. In the LPP EUV light generation apparatus 12 in the above embodiments, a target in the form of droplet is diffused through irradiation with a pre-pulse laser beam to form a diffused target, and then the diffused target is irradiated with a main pulse laser beam. When the diffused target is irradiated with the main pulse laser beam in this manner, plasma can be efficiently generated from the target substance. This configuration can improve conversion efficiency (CE) from the energy of the pulse laser beam to the energy of EUV light.

The pre-pulse laser beam for forming a diffused target includes short pulses each having a pulse width shorter than one nanosecond [ns], preferably shorter than 500 picoseconds [ps], and more preferably shorter than 50 picoseconds [ps]. In addition, the fluence of each pulse of the pre-pulse laser beam is equal to or smaller than the fluence of each pulse of the main pulse laser beam, and is equal to or larger than 6.5 J/cm$^2$, preferably equal to or larger than 30 J/cm$^2$, and more preferably equal to or larger than 45 J/cm$^2$.

With such a configuration, the target can be diffused through breakdown into minute particles by shortening the pulse width of each pulse of the pre-pulse laser beam. Accordingly, when a diffused target is irradiated with the main pulse laser beam, plasma is efficiently generated from the target, which leads to improvement of the CE.

Alternatively, the target may be irradiated with a plurality of pre-pulse laser beams before irradiation with the main pulse laser beam.

Figure 19:
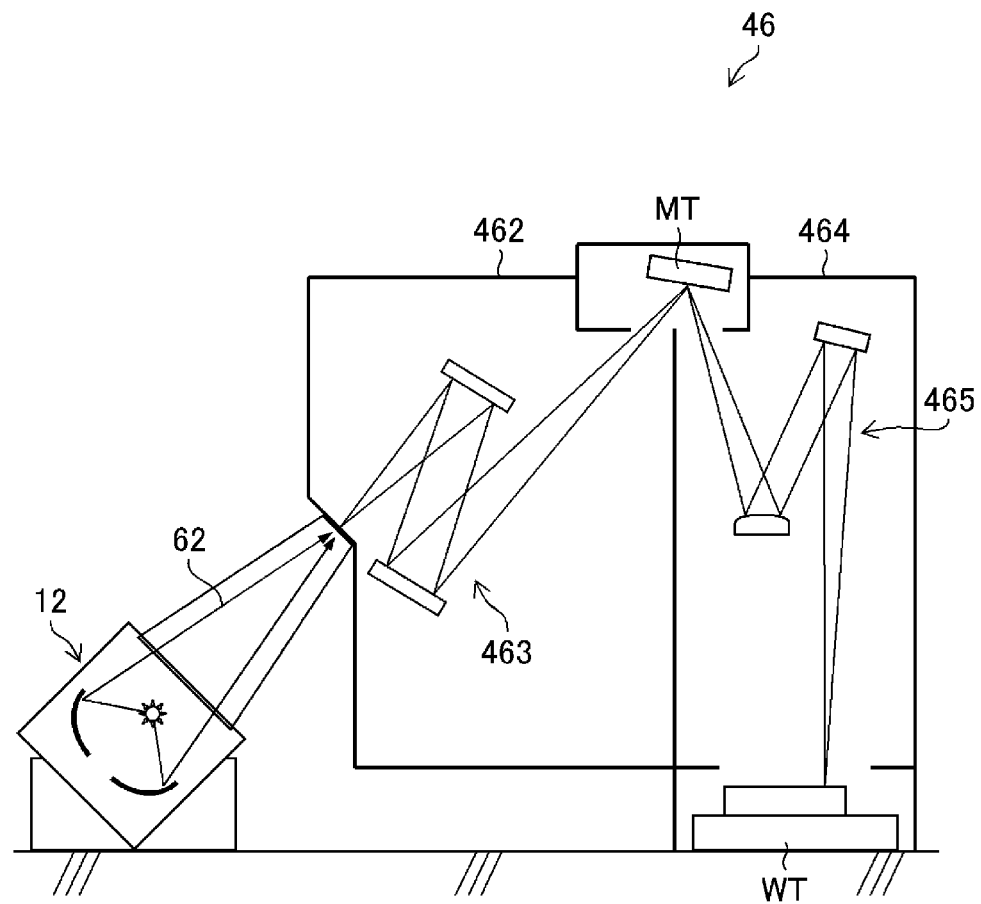
FIG. 19 is a diagram illustrating a schematic configuration of an exposure apparatus connected with the EUV light generation apparatus.

18. Exemplary Electronic Device Manufacturing Method Using EUV Light Generation Apparatus FIG. 19 is a diagram illustrating a schematic configuration of the exposure apparatus connected with the EUV light generation apparatus. In FIG. 19, the exposure apparatus 46 includes a mask irradiation unit 462 and a workpiece irradiation unit 464. The mask irradiation unit 462 illuminates a mask pattern on a mask table MT through a reflection optical system 463 with the EUV light 62 incident from the EUV light generation apparatus 12.

The workpiece irradiation unit 464 images, through a reflection optical system 465, the EUV light 62 reflected by the mask table MT on a workpiece (not illustrated) disposed on a workpiece table WT.

The workpiece is a photosensitive substrate such as a semiconductor wafer to which photoresist is applied. The exposure apparatus 46 translates the mask table MT and the workpiece table WT in synchronization to expose the workpiece to the EUV light with the mask pattern reflected.

Through an exposure process as described above, a device pattern is transferred onto the semiconductor wafer, thereby manufacturing a semiconductor device. The semiconductor device is an exemplary electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device comprising:
a tank in which a target substance in a liquid form is housed;
a nozzle through which the target substance housed in the tank is output;
a vibration element driven by an electric signal to generate a droplet of the target substance by providing, through a vibration propagation path, vibration to the target substance output through the nozzle;
a vibration propagation path component forming at least part of the vibration propagation path;
a first temperature adjustment mechanism configured to adjust a temperature of a refrigerant to be supplied to the vibration propagation path component to a first temperature;
a temperature sensor configured to detect a temperature of the vibration propagation path;
a second temperature adjustment mechanism configured to adjust, to a second temperature, the temperature of the vibration propagation path to which the refrigerant is supplied;
a control unit configured to control the second temperature adjustment mechanism based on an output from the temperature sensor; and
an energy detector configured to detect energy radiated to the vibration element and the vibration propagation path component from outside of the vibration element and the vibration propagation path component, wherein
the control unit controls the second temperature adjustment mechanism based on the output from the temperature sensor and an output from the energy detector.

2. The target supply device according to claim 1, wherein the energy detector is a heat amount detector configured to detect a heat amount as the energy.

3. The target supply device according to claim 1, wherein the control unit includes a first control unit configured to feedback-control the second temperature adjustment mechanism based on the output from the temperature sensor, and a second control unit configured to feedforward-control the second temperature adjustment mechanism based on the output from the energy detector.

4. A target supply device comprising:
a tank in which a target substance in a liquid form is housed;
a nozzle through which the target substance housed in the tank is output;
a vibration element driven by an electric signal to generate a droplet of the target substance by providing, through a vibration propagation path, vibration to the target substance output through the nozzle;
a vibration propagation path component forming at least part of the vibration propagation path;
a temperature adjustment mechanism configured to adjust a temperature of the vibration propagation path to a specified control temperature;
an energy detector configured to detect energy radiated to the vibration element and the vibration propagation path component from outside of the vibration element and the vibration propagation path component; and
a control unit configured to control the temperature adjustment mechanism based on an output from the energy detector.

5. The target supply device according to claim 4, wherein the energy detector is a heat amount detector configured to detect a heat amount as the energy.

6. The target supply device according to claim 4, wherein the control unit feedforward-controls the temperature adjustment mechanism based on the output from the energy detector.

7. The target supply device according to claim 4, further comprising a temperature sensor configured to detect the temperature of the vibration propagation path, wherein
the control unit includes a first control unit configured to feedback-control the temperature adjustment mechanism based on an output from the temperature sensor, and a second control unit configured to feedforward-control the temperature adjustment mechanism based on the output from the energy detector.

8. The target supply device according to claim 4, further comprising a chiller unit configured to circulate cooling water supplied to the vibration propagation path component, wherein
the temperature adjustment mechanism is mounted on the chiller unit to adjust an exit temperature of the chiller unit.

9. The target supply device according to claim 4, further comprising a chiller unit configured to circulate cooling water supplied to the vibration propagation path component, wherein
the temperature adjustment mechanism includes at least one of a heating device and a cooling device disposed on a cooling water supply flow path for supplying the cooling water to the vibration propagation path component through a cooling water exit of the chiller unit.

10. The target supply device according to claim 4, wherein the temperature adjustment mechanism includes at least one of a heating device and a cooling device disposed at a vibration unit including the vibration element and the vibration propagation path component.

11. The target supply device according to claim 4, further comprising a plasma shielding plate that restricts a range in which the vibration propagation path component is exposed to radiation from plasma generated when the target substance output through the nozzle is irradiated with a laser beam, wherein
the plasma shielding plate is provided with a hole through which the droplet passes and disposed on a droplet trajectory from the nozzle to a plasma generation region.

12. An extreme ultraviolet light generation apparatus comprising:
the target supply device according to claim 4; and
a chamber into which the target substance output through the nozzle of the target supply device is supplied, the extreme ultraviolet light generation apparatus being configured to irradiate the target substance supplied into the chamber with a laser beam to generate plasma from the target substance and generate extreme ultraviolet light from the plasma.

13. An electronic device manufacturing method comprising:
supplying a target substance from a target supply device into a chamber with an extreme ultraviolet light generation apparatus and irradiating the target substance with a laser beam to generate plasma from the target substance and generate extreme ultraviolet light from the plasma, the extreme ultraviolet light generation apparatus including
the chamber, and
the target supply device configured to supply the target substance into the chamber;
outputting the extreme ultraviolet light to an exposure apparatus;
exposing a photosensitive substrate to the extreme ultraviolet light in the exposure apparatus to manufacture an electronic device,
the target supply device including
a tank in which a target substance in a liquid form is housed,
a nozzle through which the target substance housed in the tank is output,
a vibration element driven by an electric signal to generate a droplet of the target substance by providing, through a vibration propagation path, vibration to the target substance output through the nozzle,
a vibration propagation path component forming at least part of the vibration propagation path,
a temperature adjustment mechanism configured to adjust a temperature of the vibration propagation path to a specified control temperature,
an energy detector configured to detect energy radiated to the vibration element and the vibration propagation path component from outside of the vibration element and the vibration propagation path component, and
a control unit configured to control the temperature adjustment mechanism based on an output from the energy detector.

* * * * *